(12) United States Patent
Hong et al.

(10) Patent No.: US 10,269,928 B2
(45) Date of Patent: Apr. 23, 2019

(54) SEMICONDUCTOR DEVICES HAVING 3D CHANNELS, AND METHODS OF FABRICATING SEMICONDUCTOR DEVICES HAVING 3D CHANNELS

(71) Applicant: SAMSUNG ELECTRONICS CO., LTD., Suwon-si, Gyeonggi-Do (KR)

(72) Inventors: Soo-Hun Hong, Gunpo-si (KR); Hee-Soo Kang, Seoul (KR); Hyun-Jo Kim, Seoul (KR); Sang-Pil Sim, Seongnam-si (KR); Hee-Don Jung, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/717,843

(22) Filed: Sep. 27, 2017

(65) Prior Publication Data

US 2018/0019321 A1 Jan. 18, 2018

Related U.S. Application Data

(60) Continuation of application No. 15/164,246, filed on May 25, 2016, now Pat. No. 10,002,943, which is a
(Continued)

(30) Foreign Application Priority Data

Aug. 22, 2013 (KR) .......................... 10-2013-0099402

(51) Int. Cl.
*H01L 29/161* (2006.01)
*H01L 29/66* (2006.01)
(Continued)

(52) U.S. Cl.
CPC ...... *H01L 29/66545* (2013.01); *H01L 21/762* (2013.01); *H01L 21/76229* (2013.01);
(Continued)

(58) Field of Classification Search
CPC .................. H01L 29/0649; H01L 29/161; H01L 27/0886
See application file for complete search history.

(56) References Cited

U.S. PATENT DOCUMENTS

| 6,962,862 B2 | 11/2005 | Kumamoto |
| 7,056,781 B2 | 6/2006 | Yoon et al. |
(Continued)

FOREIGN PATENT DOCUMENTS

| CN | 103855219 A | 6/2014 |
| JP | 2000357733 A | 12/2000 |
(Continued)

OTHER PUBLICATIONS

The Office Action (dated Apr. 13, 2018) issued by the SIPO for Chinese patent application No. 201410058492.X which was filed Feb. 20, 2014.
(Continued)

*Primary Examiner* — Trang Q Tran
(74) *Attorney, Agent, or Firm* — Volentine, Whitt & Francos, PLLC

(57) ABSTRACT

A semiconductor device includes a substrate including first to third fins aligned in a first direction, a first trench arranged between the first fin and the second fin, and a second trench arranged between the second fin and the third fin. The semiconductor device further includes a first field insulating film arranged in the first trench, a second field insulating film formed in the second trench, a first dummy gate arranged on the first field insulating film and a second dummy gate at least partly arranged on the second field insulating film. A lower surface of the second field insulating film is arranged to be lower than a lower surface of the first field insulating film.

8 Claims, 26 Drawing Sheets

Related U.S. Application Data division of application No. 14/504,822, filed on Oct. 2, 2014, now Pat. No. 9,379,106, which is a continuation-in-part of application No. 14/102,897, filed on Dec. 11, 2013, now Pat. No. 8,878,309.

(51) Int. Cl.

| | | |
|---|---|---|
| *H01L 27/088* | (2006.01) | |
| *H01L 29/06* | (2006.01) | |
| *H01L 21/8234* | (2006.01) | |
| *H01L 21/8238* | (2006.01) | |
| *H01L 27/092* | (2006.01) | |
| *H01L 29/08* | (2006.01) | |
| *H01L 29/16* | (2006.01) | |
| *H01L 21/762* | (2006.01) | |
| *H01L 29/78* | (2006.01) | |
| *H01L 29/165* | (2006.01) | |

(52) U.S. Cl.
CPC ............... *H01L 21/823431* (2013.01); *H01L 21/823481* (2013.01); *H01L 21/823814* (2013.01); *H01L 21/823821* (2013.01); *H01L 21/823878* (2013.01); *H01L 27/0886* (2013.01); *H01L 27/0924* (2013.01); *H01L 29/0649* (2013.01); *H01L 29/0653* (2013.01); *H01L 29/0847* (2013.01); *H01L 29/161* (2013.01); *H01L 29/1608* (2013.01); *H01L 29/66795* (2013.01); *H01L 29/785* (2013.01); *H01L 21/823412* (2013.01); *H01L 21/823425* (2013.01); *H01L 29/165* (2013.01); *H01L 29/7848* (2013.01)

(56) References Cited

U.S. PATENT DOCUMENTS

| | | | |
|---|---|---|---|
| 7,226,842 | B2 | 6/2007 | Murthy et al. |
| 7,498,246 | B2 | 3/2009 | Kim |
| 7,528,033 | B2 | 5/2009 | Kim |
| 7,592,675 | B2 | 9/2009 | Liaw |
| 7,786,518 | B2 | 8/2010 | Chakravarthi et al. |
| 7,951,657 | B2 | 5/2011 | Cheng et al. |
| 7,964,910 | B2 | 6/2011 | Dyer |
| 8,227,859 | B2 | 7/2012 | Lee et al. |
| 8,304,840 | B2 | 11/2012 | Teo et al. |
| 2005/0173759 | A1 | 8/2005 | Kim et al. |
| 2009/0242995 | A1 | 10/2009 | Suzuki et al. |
| 2009/0315116 | A1* | 12/2009 | Sakuma ............ H01L 21/28518 257/368 |
| 2011/0133290 | A1 | 6/2011 | Muramatsu |
| 2012/0091539 | A1 | 4/2012 | Fan et al. |
| 2012/0299115 | A1 | 11/2012 | Chuang et al. |
| 2013/0187237 | A1 | 7/2013 | Yu et al. |

FOREIGN PATENT DOCUMENTS

| | | |
|---|---|---|
| JP | 2005136376 A | 5/2005 |
| JP | 2006319295 A | 11/2006 |
| JP | 2007173789 A | 7/2007 |
| JP | 2009517867 A | 4/2009 |
| JP | 2010003812 A | 1/2010 |
| KR | 2006-0064175 A | 6/2006 |
| KR | 10-0733417 B1 | 6/2007 |

OTHER PUBLICATIONS

U.S. Appl. No. 14/021,465, filed Sep. 9, 2013.

* cited by examiner

SEMICONDUCTOR DEVICES HAVING 3D CHANNELS, AND METHODS OF FABRICATING SEMICONDUCTOR DEVICES HAVING 3D CHANNELS

CROSS-REFERENCE TO RELATED APPLICATIONS

This is a Continuation of U.S. application Ser. No. 15/164,246, filed May 25, 2016, which is a Divisional of U.S. non-provisional application Ser. No. 14/504,822, filed Oct. 2, 2014, the disclosure of which is incorporated by reference herein in its entirety, which is a Continuation-In-Part (CIP) of U.S. non-provisional application Ser. No. 14/102,897, filed on Dec. 11, 2013, and issued as U.S. Pat. No. 8,878,309 on Nov. 4, 2014, the disclosure of which is incorporated by reference herein in its entirety.

BACKGROUND

The inventive concept relates to semiconductor devices having three-dimensional (3D) channels and to methods of fabricating semiconductor devices having 3D channels.

Various techniques have been developed to increase the integration density of semiconductor devices. One current technique is to provide a multi-gate transistor configuration in which a fin-shaped (or nanowire-shaped) silicon body is formed from a substrate, and multiple gates are formed on surfaces of the silicon body to define 3D channel regions within the silicon body.

3D channels facilitate reduction in scale at least partly because it is not necessary to increase a gate length (or channel length) to realize a transistor with relatively adequate current control capability. In addition, a short channel effect (SCE), in which the electric potential of a channel region of a transistor is affected by a drain voltage, can be effectively suppressed.

SUMMARY

In one aspect of the present invention, there is provided a semiconductor device, which includes a substrate including first to third fins aligned long in a first direction, a first trench arranged between the first fin and the second fin, and a second trench arranged between the second fin and the third fin; a first field insulating film arranged in the first trench; a second field insulating film arranged in the second trench; a first dummy gate arranged on the first field insulating film; and a second dummy gate at least partly arranged on the second field insulating film, wherein a lower surface of the second field insulating film is lower than a lower surface of the first field insulating film.

In some embodiments of the present invention, the first field insulating film may extend in a second direction that crosses the first direction, and the second field insulating film may extend in the second direction.

In another aspect of the present invention, there is provided a semiconductor device, which includes a substrate including first to third fins aligned long in a first direction, a first trench arranged between the first fin and the second fin, and a second trench arranged between the second fin and the third fin; a first field insulating film arranged in the first trench; a second field insulating film arranged in the second trench; a first dummy gate arranged on the first field insulating film; and a second dummy gate at least partly arranged on the second field insulating film, wherein the first field insulating film has a T-shaped cross section in a vertical plane.

In some embodiments of the present invention, the first field insulating film may extend in a second direction that crosses the first direction, the second field insulating film may extend in the second direction, and a lower surface of the second field insulating film may be lower than a lower surface of the first field insulating film.

In still another aspect of the present invention, there is provided a semiconductor device, which includes a substrate including first to third fins aligned long in a first direction, a first trench arranged between the first fin and the second fin, and a second trench arranged between the second fin and the third fin; a first field insulating film arranged in the first trench; a second field insulating film arranged in the second trench; a first dummy gate arranged on the first field insulating film; a second dummy gate arranged on the second fin and the second field insulating film; and a third dummy gate arranged on the third fin and the second field insulating film, wherein shapes of the second dummy gate and the third dummy gate are different from each other.

In some embodiments of the present invention, the first field insulating film may extend in a second direction that crosses the first direction, the second field insulating film may extend in the second direction, and a lower surface of the second field insulating film may be lower than a lower surface of the first field insulating film.

In yet still another aspect of the present invention, there is provided a semiconductor device, which includes a substrate including first to third fins aligned long in a first direction, a first trench arranged between the first fin and the second fin, and a second trench arranged between the second fin and the third fin; a first field insulating film arranged in the first trench; a second field insulating film arranged in the second trench; a plurality of active gates arranged on the first to third fins; a first dummy gate arranged on the first field insulating film; a second dummy gate at least partly arranged on the second field insulating film; and a source/drain arranged between the plurality of active gates or between at least one of the plurality of active gates and the first dummy gate, wherein the first field insulating film and the second field insulating film have different heights, and a lower surface of at least one of the plurality of active gates is lower than an upper surface of the source/drain.

BRIEF DESCRIPTION OF THE DRAWINGS

The above and other objects, features and advantages of the inventive concept will be more apparent from the following detailed description of preferred embodiments made in conjunction with the accompanying drawings, in which.

DETAILED DESCRIPTION OF THE EMBODIMENTS

Figure 1:
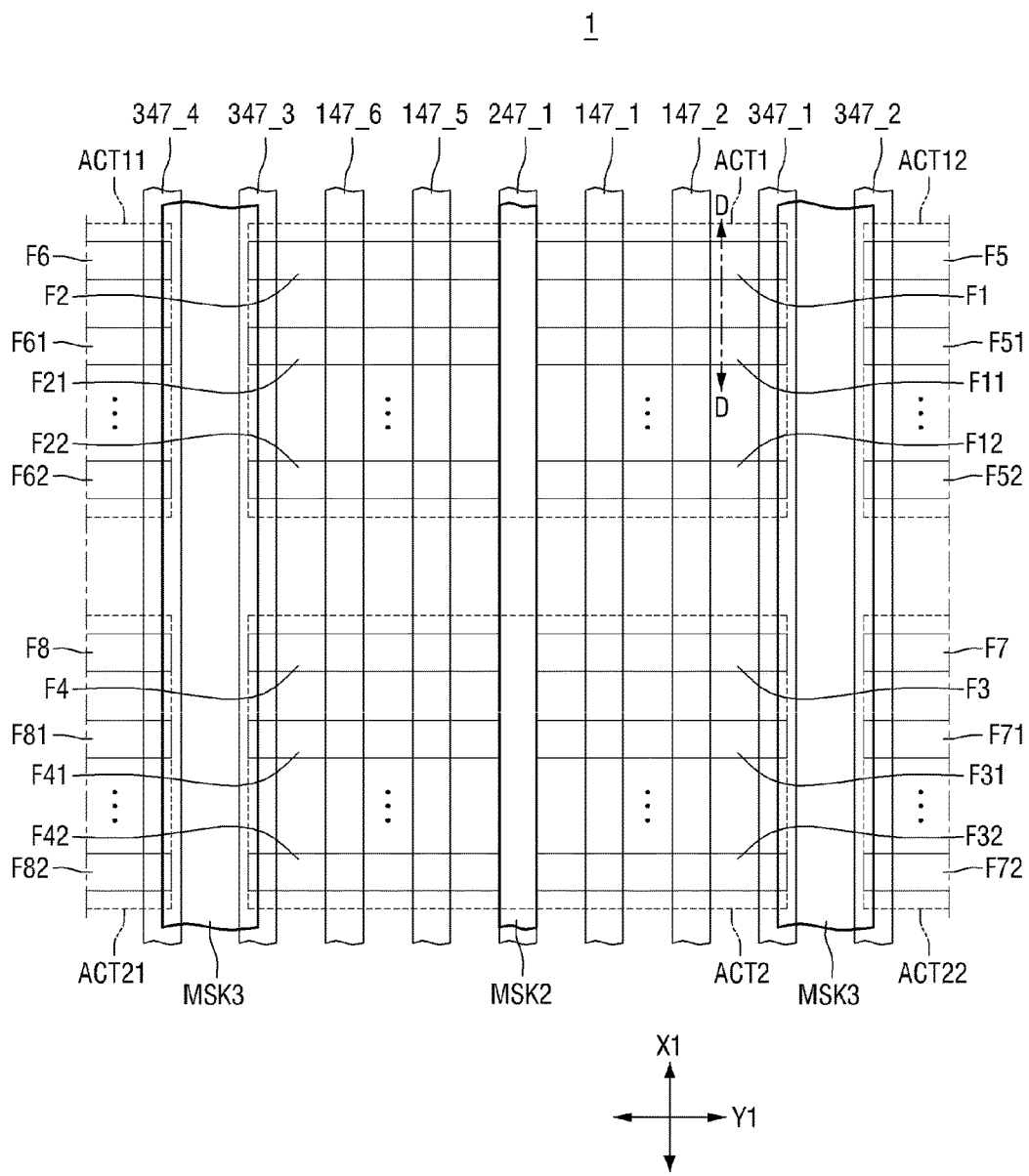
FIG. 1 is a diagram of a layout of various elements of a semiconductor device according to the inventive concept.

Advantages and features of the inventive concept and methods of accomplishing the same may be understood more readily by reference to the following detailed description of preferred embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the invention to those skilled in the art, and the inventive concept will only be defined by the appended claims. In the drawings, the thickness of layers and regions are exaggerated for clarity.

Also, like reference numeral are used to designate like elements throughout the drawings. Therefore, detailed descriptions of some elements of certain embodiments may be omitted for the sake of brevity when like elements of other embodiments have already been described in detail.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) in the orientation illustrated in the figures. Also, as the drawings will generally show, the term "upper" may be used to connote the uppermost surface of a particular element in the orientation shown in the figures. Likewise, the term "lower" may be used to connote the lowermost surface of a particular element in the orientation shown in the figures.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. are used herein to describe various elements, these elements are not to be limited by these terms. These terms are only used to distinguish one element from another according to the order in which they are mentioned in the specification and claims. Thus, although one element may be referred to as a first element at one point in this disclosure, the same element may be referred to as a second element at another point in the disclosure.

The inventive concept will be described with reference to perspective views, cross-sectional views, and/or plan views, in which preferred embodiments of the invention are shown. In actuality, regions or features may have shapes or relative sizes which are different than what is shown due to manufacturing techniques and/or allowances. That is, regions shown in the drawings are illustrated in schematic form and the shapes of the regions are presented simply by way of illustration and not as a limitation.

Unless defined otherwise, all technical and scientific terms used herein have the same meaning as commonly understood by one of ordinary skill in the art to which this invention belongs. Also, the term "films" may be used to refer to refer to discrete portions of the same layer of material even if those portions are contiguous.

A first embodiment of the inventive concept will now be described in detail with reference to FIGS. 1-7.

Figure 2:
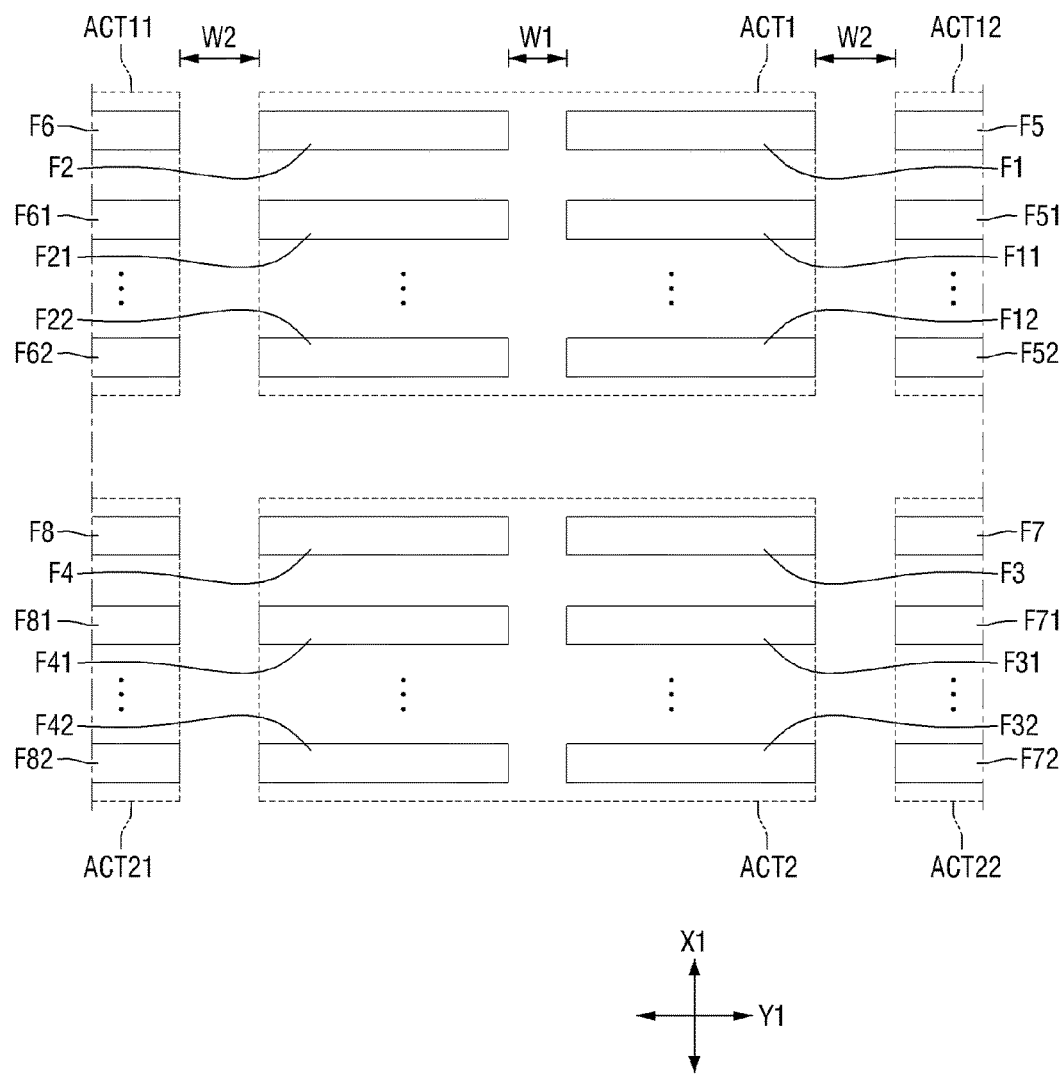
FIG. 2 is a plan view of fins and field insulating films in the layout of FIG. 1.

Reference is first made to FIGS. 1 and 2. Here, FIG. 1 is a diagram of a layout of various elements of a semiconductor device according to the inventive concept, and FIG. 2 is a plan view of fins and field insulating films in the layout of FIG. 1.

A semiconductor device 1 according to a first embodiment of the inventive concept includes a plurality of active regions ACT1 to ACT2, ACT11 to ACT21, and ACT12 to ACT22, a plurality of fins F1 to F8, F11 to F81, and F12 to F82, a plurality of gates 147_1, 147_2, 147_5, and 147_6, and a plurality of dummy gates 247_1, and 347_1 to 347_4.

The active regions ACT1 to ACT2, ACT11 to ACT21, and ACT12 to ACT22 may be arranged in the form of a matrix, as illustrated. For example, the active region ACT1 may be adjacent to the active regions ACT11 and ACT12 in a second direction Y1, and may be adjacent to the active region ACT2 in a first direction X1 perpendicular to the second direction Y1. The plurality of active regions ACT1 to ACT2, ACT11 to ACT21, and ACT12 to ACT22 may be defined by a third field insulating film (113 in FIG. 3, described later).

At least one of the fins F1 to F8, F11 to F81, and F12 to F82 is disposed in each of the respective active regions ACT1 to ACT2, ACT11 to ACT21, and ACT12 to ACT22. For example, the plurality of fins F1 to F2, F11 to F21, and F12 to F22 may be arranged in the active region ACT1, and the plurality of fins F3 to F4, F31 to F41, and F32 to F42 may be arranged in the active region ACT2.

The plurality of fins F1 to F8, F11 to F81, and F12 to F82 may each have a linear form (i.e., an elongated horizontal cross section) and extend longitudinally as viewed in plan in the second direction Y1.

Some fins (e.g., F1, F2, F5, and F6) may be aligned in their lengthwise directions (i.e., along a line in the second direction Y1 and so the second direction Y1 may be referred to hereinafter as the "lengthwise" direction of the fins). Furthermore, some fins (e.g., F1, F21, and F22) may be spaced from each other in their widthwise directions (i.e., in the first direction X1 and so the first direction X1 may also be referred to hereinafter as the "widthwise" direction of the fins).

As illustrated in FIG. 2, the distance W2 between active regions adjacent one another in the second direction Y1 (e.g., between ACT1 and ACT11, and between ACT1 and ACT12) may be greater than the distance W1 between the first fin F1 and the second fin F2 that are adjacent to each other in the second direction Y1, i.e., in the lengthwise direction of the fins.

As shown in FIG. 1, masks MSK2 and MSK3 are linear patterns each extending longitudinally in the first direction X1. However, the inventive concept is not limited thereto. The mask MSK2 is to form a second field insulating film 112 to be described later, and the mask MSK3 is to form the third field insulating film 113 to be described later.

The plurality of gates 147_1, 147_2, 147_5, and 147_6 may also each extend longitudinally in the first direction X1, and the plurality of dummy gates 247_1, and 347_1 to 347_4 may also extend longitudinally in the first direction X1.

Figure 3:
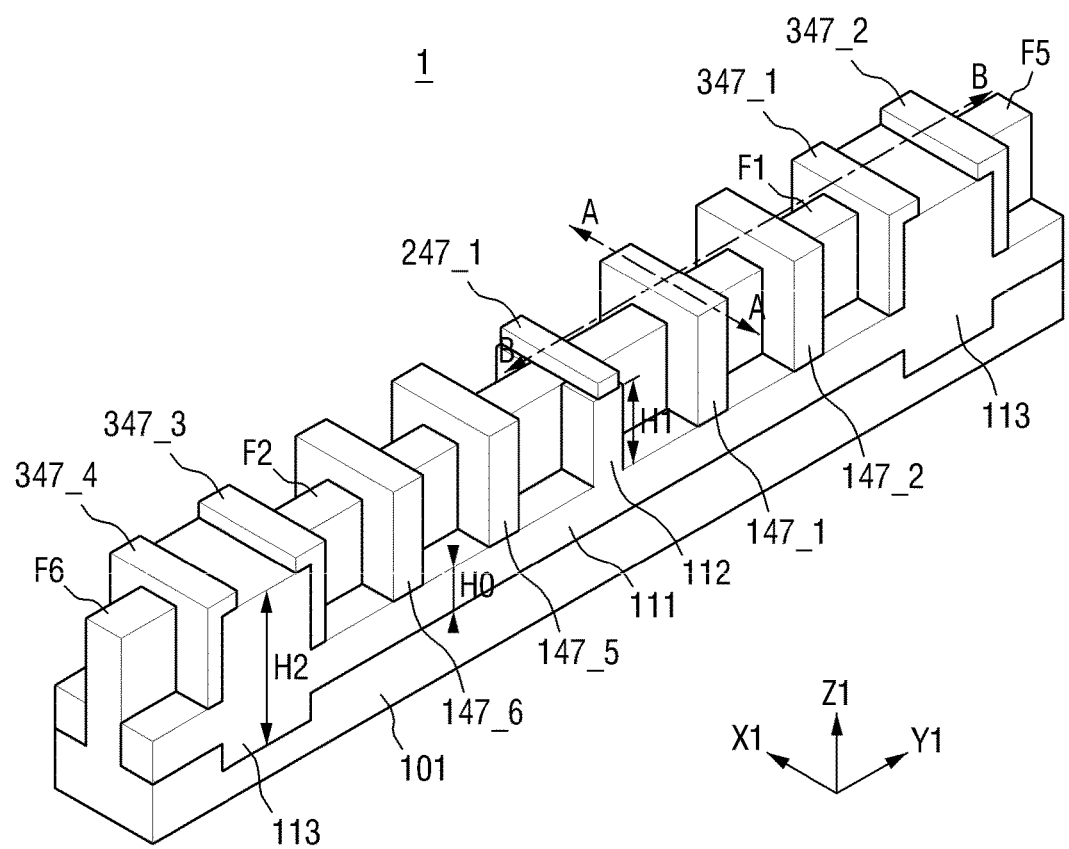
FIG. 3 is a perspective view a first embodiment of a semiconductor device according to the inventive concept.
Figure 4:
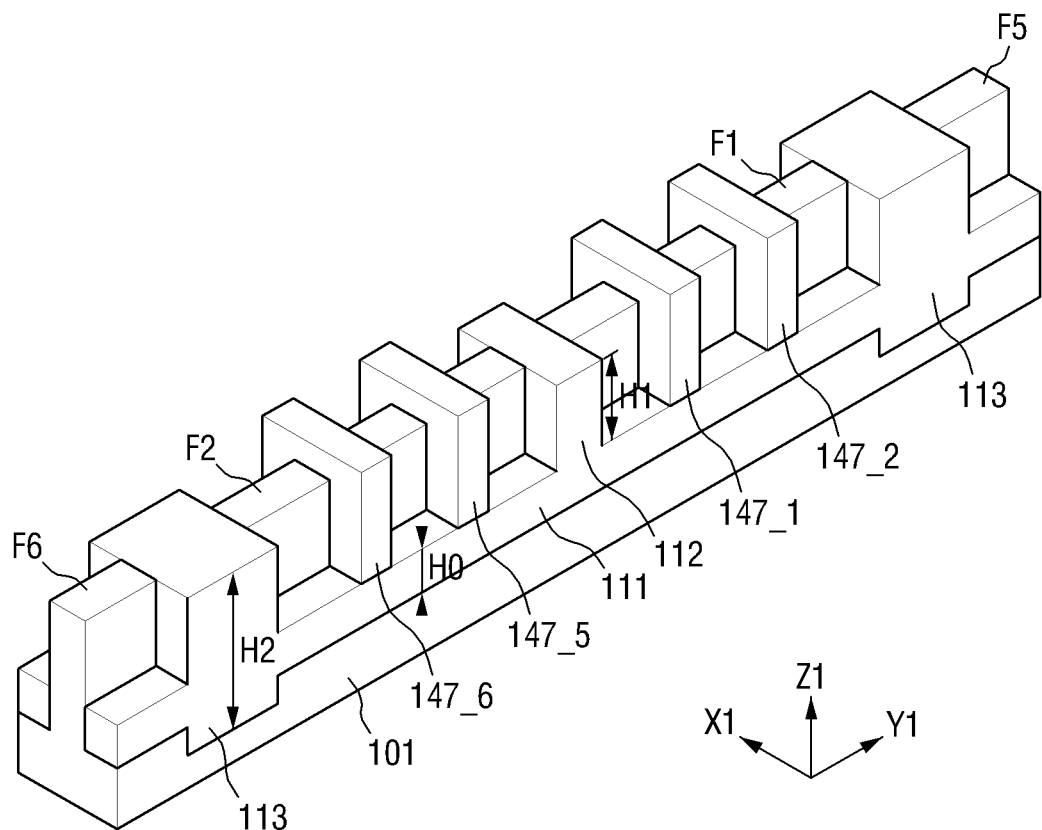
FIG. 4 is a perspective view of fins and field insulating films of the semiconductor device of FIG. 3.
Figure 5:
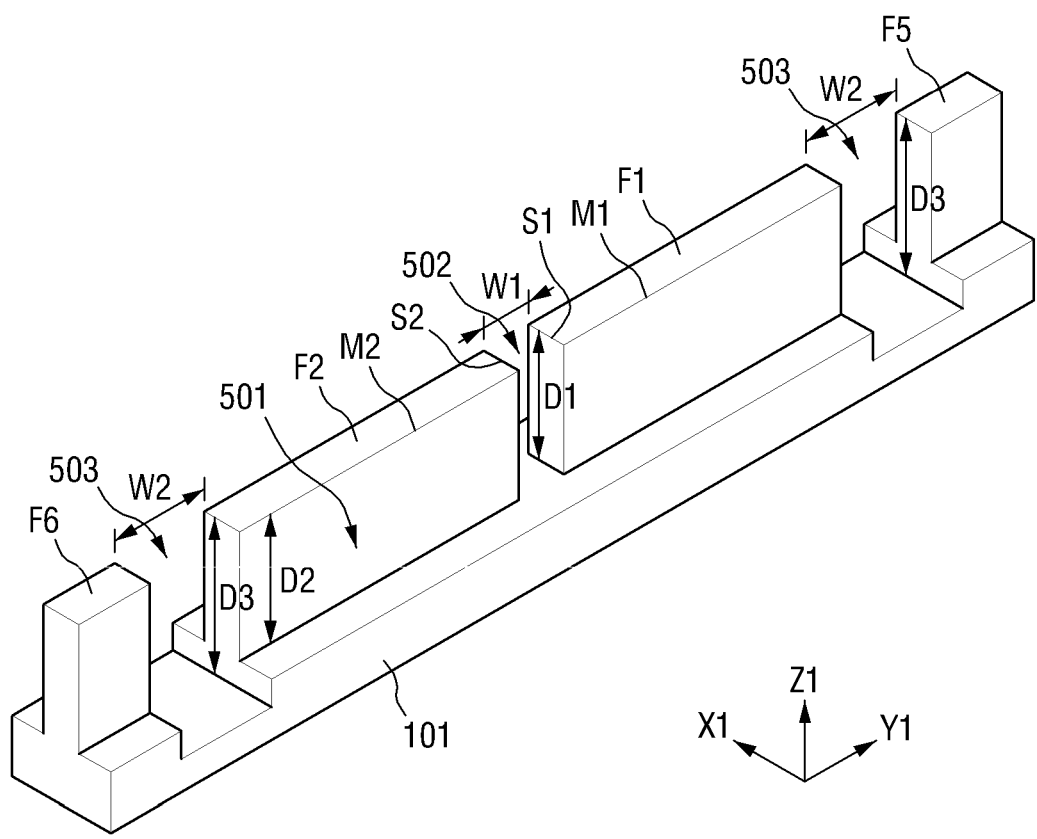
FIG. 5 is a perspective view of a substrate having fins and trenches of the semiconductor device of FIG. 3.

FIG. 3 is a perspective view a first embodiment of a semiconductor device according to the inventive concept, FIG. 4 is a perspective view of fins and field insulating films of the semiconductor device of FIG. 3, and FIG. 5 is a perspective view of a substrate having fins and trenches of the semiconductor device of FIG. 3.

As shown best in FIGS. 3-5, the fins F1, F2, F5, and F6 may be parts of a substrate 101, and may comprise an epitaxial layer that is grown from what was a bulk of the substrate 101. These figures show one of the groups of longitudinally aligned fins in which four fins F1, F2, F5, and F6 are aligned longitudinally in the lengthwise direction Y1. It will be understood, however, that the inventive concept is not limited to only four fins being aligned in each group of longitudinally aligned fins. The substrate 101 may, as examples, be made of one or more semiconductor materials selected from the group consisting of Si, Ge, SiGe, GaP, GaAs, SiC, SiGeC, InAs, and InP. Also, as another example, the substrate may be constituted by a semiconductor layer atop an underlying structure, such as an SOI (Silicon On Insulator) substrate.

FIGS. 3 to 5 also show the fins F1, F2, F5, and F6 as having the form of a rectangular parallelepiped, but the inventive concept is not limited thereto. For example, the fins F1, F2, F5, and F6 may instead each have a top whose opposite longer sides (M1 and M2 of fins F1 and F2) are chamfered or rounded. On the other hand, respective ones of the opposite shorter sides of fins adjacent each other in the lengthwise direction face each other, as exemplified in the figures by a first short side S1 of the fin F1 and a second short side S2 of the fin F2 facing each other. Even in embodiments in which the tops of the fins have chamfered or rounded sides, it is apparent that the relatively long sides M1 and M2 could still be readily discriminated from the short sides S1 and S2 by those skilled in the art to which the inventive concept pertains.

The fins F1, F2, F5, and F6 constitute an active pattern of a multi-gate transistor device. That is, channels connected to each other may be formed along three sides of the fins F1, F2, F5, and F6, or may be formed on sides of the fins F1, F2, F5, and F6 that face each other.

Furthermore, as illustrated in FIG. 5, a first trench 501 delimits the long sides M1 and M2 of the fins F1 and F2. A second trench 502 delimits the short sides S1 and S2 of the fins F1 and F2, which face each other. A respective third trench 503 delimits the short sides of the fins F2 and F6 which face each other and the short sides of the fins F1 and F5 which face each other.

In the illustrated example of this embodiment, the first trench 501 and the second trench 502 are shallow trenches, and the third trench 503 is a deep trench. That is, the depth D3 of the third trench 503 is greater than the depth D1 of the first trench 501 and the depth D2 of the second trench 502. The depth D1 of the first trench 501 and the depth D2 of the second trench 502 may be equal to each other in the case in which the first trench 501 and the second trench 502 are simultaneously formed, but may differ from each other in a case in which the first trench 501 and the second trench 502 are formed during different stages of the manufacturing process.

Referring once again to FIG. 3, the field insulating films 111, 112, and 113 may be disposed on the substrate 101, and surround parts of the fins F1, F2, F5, and F6.

Also, in the illustrated example of this embodiment, the first field insulating film 111 extends longitudinally in the second direction Y1, and the second field insulating film 112 and the third field insulating film 113 extend longitudinally in the first direction X1. The field insulating film 111, 112, or 113 may, as examples, be formed of an oxide, a nitride, an oxynitride, or combinations thereof.

Furthermore, the first field insulating film 111 is formed in at least a part of the first trench 501, the second field insulating film 112 is formed in at least a part of the second trench 502, and a respective third field insulating film 113 is formed in at least a part of each third trench 503. In other words, the first field insulating film 111 may contact with the long sides M1 and M2 of the fins F1 and F2, and the second field insulating film 112 may contact confronting ones of the short sides S1 and S2 of the fins F1 and F2. That is, the second field insulating film 112 contacts side wall surfaces of the fins F1 and F2. One third field insulating film 113 may contact confronting ones of the short sides of the fins F2 and F6, and another third field insulating film 113 may contact confronting ones of the short sides of the fins F1 and F5.

Whereas the first field insulating film 111 may occupy only a part of the first trench 501, the second field insulating film 112 may fill the second trench 502 and a third field insulating film 113 may fill a third trench 503. In this case, the upper surface of the first field insulating film 111 is lower than the upper surface of the second field insulating film 112 and the upper surface of the third field insulating film 113. In FIGS. 3 and 4 (and some other figures described later herein), the height of the first field insulating film 111 is H0, the height of the second field insulating film 112 is H0+H1, and the height of the third field insulating film 113 is H2. That is, the second field insulating film 112 may be taller (or thicker) than the first field insulating film 111 by H1, and the third field insulating film 113 may be taller (or thicker) than the second field insulating film 112 by H2−(H0+H1). Furthermore, the width W2 of the third field insulating film 113 may be greater than the width W1 of the second field insulating film 112.

The gates 147_1, 147_2, 147_5, and 147_6 may be disposed on and across the fins F1, F2, F5, and F6. For example, the first and second gates 147_1 and 147_2 may each be disposed on and across the first fin F1, and the fifth and sixth gates 147_5 and 147_6 may be disposed on and across the second fin F2.

In the example of this embodiment, only one first dummy gate is formed on the second field insulating film 112. This is exemplified in FIG. 3 by the first dummy gate 247_1 disposed on the second field insulating film 112. The provision of a single dummy gate serves to keep the size of the layout of the device to a minimum. A structure, as described above, in which a field insulating film 112 and one dummy gate 247_1 disposed thereon are together interposed between adjacent fins (e.g., F1 and F2), is referred to herein as a single diffusion break. Also, in the example of this embodiment, the first dummy gate 247_1 is narrower than the second field insulating film 112 (see FIG. 7 described later). Accordingly, the first dummy gate 247_1 can be stably formed on and supported by the second field insulating film 112.

Furthermore, in the example of this embodiment, the second dummy gate 347_1 is formed on the third field insulating film 113 and the first fin F1, and the third dummy gate 347_2 is formed on the third field insulating film 113 and the fifth fin F5. Similarly, the fourth dummy gate 347_3 is formed on the third field insulating film 113 and the second fin F2, and the fifth dummy gate 347_4 is formed on the third field insulating film 113 and the sixth fin F6. A structure, which includes a field insulating film 113 and two dummy gates disposed thereon (e.g., 347_1 and 347_2) interposed between adjacent fins (e.g., F1 and F5), is referred to herein as a double diffusion break.

Figure 6A:
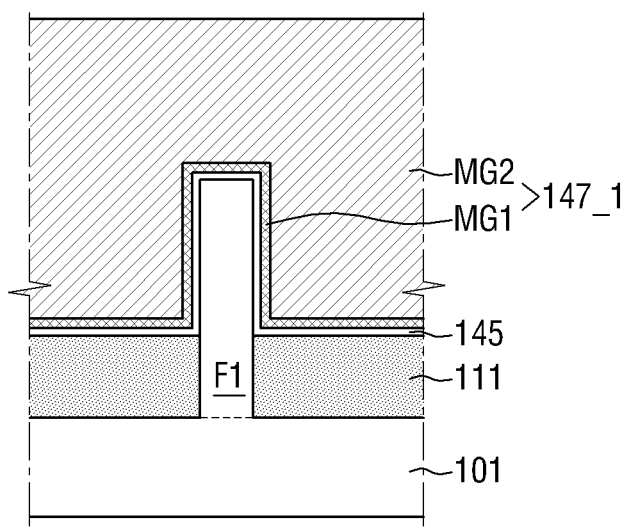
FIG. 6A is an exemplary cross-sectional view taken along line A-A of FIG. 3.
Figure 7:
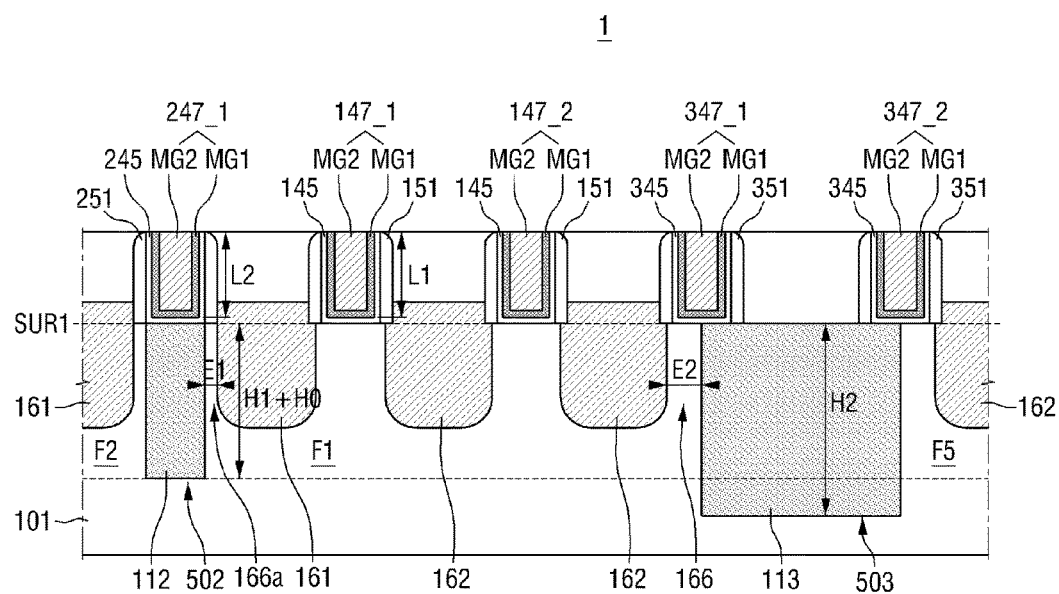
FIG. 7 is an exemplary cross-sectional view taken along line B-B of FIG. 3.

Reference is now made to FIGS. 6A and 7, in which FIG. 6A is an exemplary cross-sectional view taken along line A-A of FIG. 3, and FIG. 7 is an exemplary cross-sectional view taken along line B-B of FIG. 3.

Each gate (e.g., 147_1) may include two or more metal layers MG1 and MG2. In this case, the first metal layer MG1 serves to adjust a work function. To this end, the first metal layer MG1 may, as examples, be formed of at least one material selected from the group consisting of TiN, TaN, TiC, and TaC. On the other hand, the second metal layer MG2 serves to fill a space that is left by the first metal layer MG1. The second metal layer MG2 may, as examples, be formed of W or Al. The gate 147_1 can be formed by a replacement process (or gate last process), or other known processes per se.

Each dummy gate (e.g., 247_1) may have a sectional structure that is similar to that of the gate 147_1. For example, in the illustrated embodiment, the dummy gate 247_1 includes two metal layers MG1 and MG2 of the same cross-sectional shapes and sizes and of the same compositions as those of the gate 147_1.

A gate insulating film 145 is interposed between the first fin F1 and the gate 147_1. As illustrated in FIG. 6A, the gate insulating film 145 may extend on an upper surface of the first fin F1 and an upper portion of a side surface of the first fin F1. Furthermore, the gate insulating film 145 may be interposed between the gate 147_1 and the first field insulating film 111. The gate insulating film 145 may include a high-k dielectric, i.e., a material having a dielectric constant higher than that of silicon oxide. As examples, the gate insulating film 145 may be a film of $HfO_2$, $ZrO_2$, or $Ta_2O_5$. As illustrated, the gate insulating film 145 may extend upward along a side surface of each gate (e.g., 147_1). Similarly, the gate insulating films 145 and 345 arranged on a lower portion of each dummy gate (e.g., 247_1, 347_1) may extend upward along a side surface of each dummy gate (e.g., 247_1, 347_1).

As shown in FIG. 7, a plurality of sources/drains 161 and 162 may be provided between the plurality of gates 147_1, 147_2, 147_5, and 147_6, and between the gate (e.g., 147_1) and the dummy gate (e.g., 247-1). The sources/drains 161 and 162 may be elevated sources/drains which project above the level of the upper surface of the fins F1, F2, F5, and F6). Furthermore, the sources/drains 161 and 162 may be formed such that parts thereof overlap spacers 151 and/or 251 and/or 351. In the example of FIG. 7, one side of the sources/drains 161 is aligned with an outer edge of the spacers 251, the other side of the source/drains 161 overlaps the spacers 151, and the sources/drains 162 overlap parts of the spacers 151 and 351.

The upper surface of each source/drain 162 arranged between adjacent ones of gates 147_1, 147_2, 147_5, and 147_6 and the upper surface of each source/drain 162 arranged between one of the gates 147_1, 147_2, 147_5, and 147_6 and a respective dummy gate 247_1 are substantially coplanar. Herein, the use of the term "substantially" is to recognize that there may be some vertical offset in the surfaces due to errors that naturally occur in the manufacturing process.

In the case where the semiconductor device 1 is a PMOS transistor, the sources/drains 161 and 162 may include a compressive stress-inducing material. For example, the compressive stress-inducing material may be a material having a large lattice constant compared to Si, and for example, may be SiGe. The compressive stress-inducing material may improve mobility of carriers in a channel region by applying of a compressive stress to the first fin F1.

On the other hand, in the case where the semiconductor device 1 is an NMOS transistor, the sources/drains 161 and 162 may be of the same material as the substrate 101 or a tensile stress-inducing material. For example, if the substrate 101 is made of Si, the sources/drains 161 and 162 may be Si, or a material (e.g., SiC) having a smaller lattice constant than Si.

In either case of a PMOS and an NMOS, the structures may be fabricated by forming trenches in the first fin F1 using the active and dummy gates as an etch mask, and then epitaxially growing the source drain regions 161 and 162 within the trenches.

In another example of this embodiment, the sources/drains may be formed by doping the fins F1 and F2 with impurities.

The spacers 151 and 251 may include at least one of a nitride film and an oxynitride film. The spacers 151 and 251 may be formed on side wall surfaces of the plurality of fins F1 and F2, the plurality of gates 147_1, 147_2, 147_5, and 147_6, and the plurality of dummy gates 247_1.

In the example of this embodiment illustrated in FIG. 7, the upper surface of the second field insulating film 112 may lie on the same plane SUR1 as the upper surface of the adjacent fins F1 and F2. The upper surface of the third field insulating film 113 lie on the same plane SUR1 as the upper surface of the adjacent fins F1 and F5. Again, however, the term "substantially" is used to encompass errors naturally occurring in the manufacturing process which may give rise to slight offsets in the upper surfaces from a common plane.

Accordingly, the height L1 of the gate (e.g., 147_1) that is formed on the fin (e.g., F1) may be equal to the height L2 of the dummy gates 247_1 and 347_1 to 347_4 formed on the second field insulating film 112 and the third field insulating film 113. That is, variations in the heights L1 of the plurality of gates 147_1, 147_2, 147_5, and 147_6 may be greatly reduced. As described above, the gates 147_1, 147_2, 147_5, and 147_6 may be formed using metal, and variations among the heights of the gates 147_1, 147_2, 147_5, and 147_6 cause the operating characteristics to also vary. Accordingly, the operating characteristics of gates 147_1, 147_2, 147_5, and 147_6 are substantially uniform because the heights of the gates are substantially the same.

Furthermore, the upper surface of the third field insulating film 113 may lie on the same plane SUR1 as the upper surface of the second field insulating film 112.

Furthermore, the second field insulating film 112 is wider than the dummy gate 247_1. Accordingly, the dummy gate 247_1 can be stably supported by the second field insulating film 112.

Furthermore, a first part 166a of the semiconductor layer constituting the fin F1 may be interposed between the second field insulating film 112 (or second trench 502) and the source/drain 161. Furthermore, a second part 166 of semiconductor layer constituting the fin F1 may be interposed between the third field insulating film 113 (or third trench 503) and the source/drain 162. As illustrated in FIG. 7, the width El of the first part 166a of the semiconductor layer is less than the width E2 of the second part 166 of the semiconductor layer. In other words, the part 166a of the semiconductor layer that is located just below the single diffusion break may be smaller than the part 166 of the semiconductor layer that is located just below the double diffusion break.

Figure 6B:
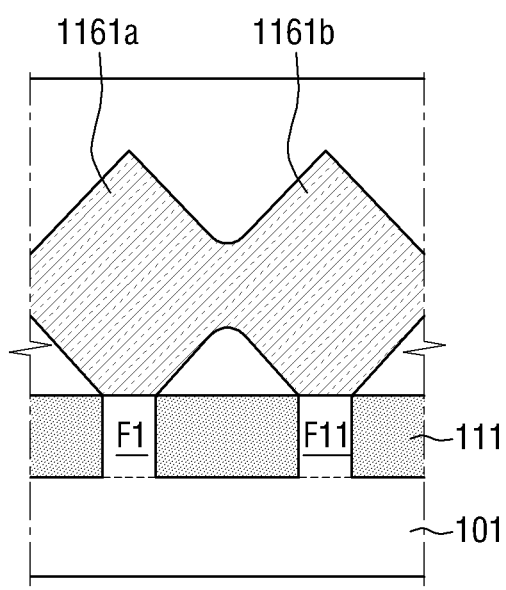
FIG. 6B is an exemplary cross-sectional view taken along line D-D of FIG. 1.

FIG. 6B is an exemplary cross-sectional view taken along line D-D of FIG. 1 showing an example of overlapping sources/drains of adjacent fins. Referring to FIG. 6B, in this example, sources/drains 1161a and 1161b are formed on the fins (e.g., F1 and F11 in FIG. 1) that are adjacent to each other in the widthwise direction (the first direction X1 in FIG. 1). As shown, the sources/drains 1161a and 1161b may contact each other or may be merged. This can result from a merger of epitaxial grown material, and/or by an overlap of diffusion regions. Therefore, electrically equal voltage signals may be applied thereto. This merger or overlap (in the X1 direction) may occur with respect to sources/drains 161 and/or 162 shown in FIG. 7, although the inventive concept is not limited thereto.

A second embodiment of a semiconductor device according to the inventive concept will now be described with reference to FIGS. 8A, 8B and 8C, which are cross-sectional view illustrating respective examples of the second embodiment. To avoid redundancy, a detailed description is omitted of elements of the second embodiment that are the same or similar to those of the previously described first embodiment.

Figure 8A:
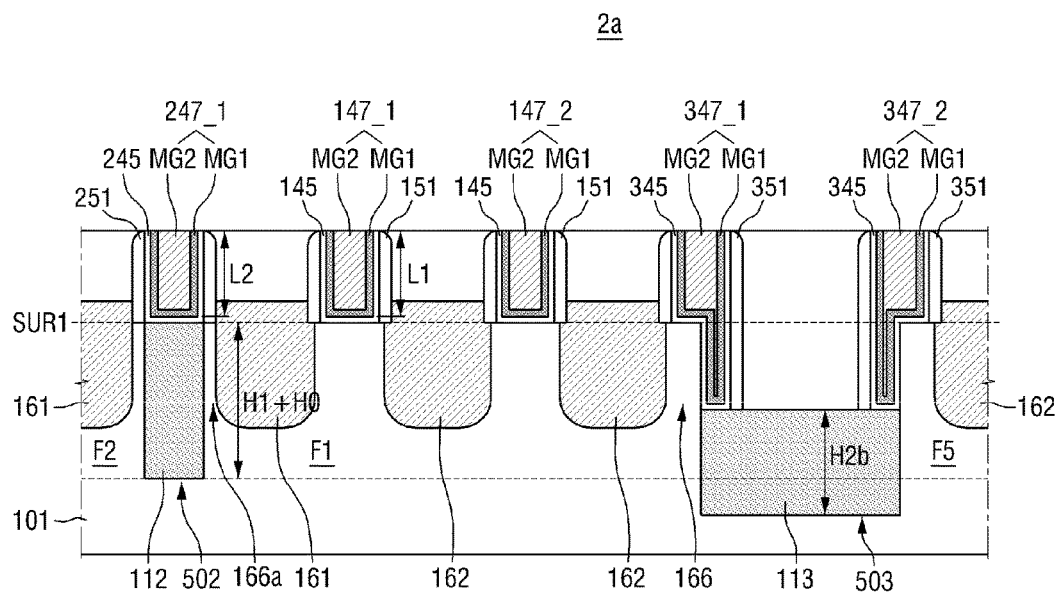
FIG. 8A is a cross-sectional view of one example of a second embodiment of a semiconductor device according to the inventive concept.

In the example of the semiconductor device 2a illustrated in FIG. 8A, the upper surface of the third field insulating film 113 is lower than the upper surface of the adjacent fin F1 or F5. As illustrated, the upper surface of the second field insulating film 112 lies substantially on the same plane SUR1 as the upper surface of the fin F1 or F2. Furthermore, the upper surface of the second field insulating film 112 may be disposed at a level higher than that of the upper surface of the fin F1 or F2. Accordingly, the upper surface of the third field insulating film 113 may be disposed at a level lower than that of the upper surface of the second field insulating film 112.

Furthermore, the height H2b of the third field insulating film 113 may be lower than the height H1+H0 of the second field insulating film 112.

Because the upper surface of the third field insulating film 113 is disposed at a level lower than that of the upper surface of the adjacent fin F1 or F5, one part of the second dummy gate 347_1 may be positioned on the upper surface of the fin F1, and the other part thereof may be positioned in the third trench 503. One part of the third dummy gate 347_2 may be positioned on the upper surface of the fin F5, and the other part thereof may be positioned in the third trench 503.

Furthermore, parts of the metal layers MG1 and MG2 of the second dummy gate 347_1 may be positioned in the third trench 503. That is, the metal layers MG1 and MG2 of the second dummy gate 347_1 may be formed along a side of the third trench 503 and the upper surface of the fin F1. Furthermore, parts of the metal layers MG1 and MG2 of the third dummy gate 347_2 may also be positioned in the third trench 503. That is, the metal layers MG1 and MG2 of the third dummy gate 347_2 may be formed along a side of the third trench 503 and the upper surface of the fin F5. The metal layers MG1 and MG2 of the second dummy gate 347_1 and the metal layers MG1 and MG2 of the third dummy gate 347_2 are materials for adjusting the work function.

Figure 8B:
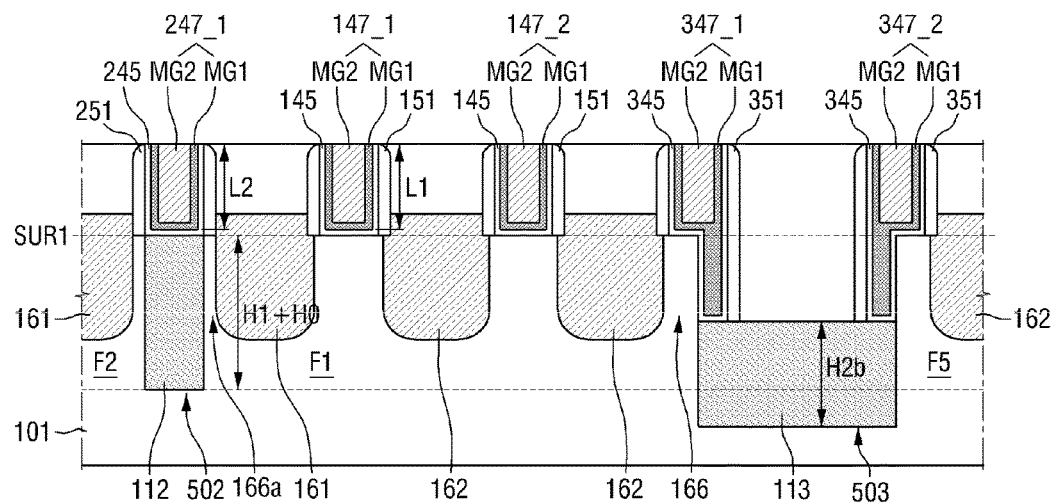
FIG. 8B is a cross-sectional view of another example of the second embodiment of a semiconductor device according to the inventive concept.

In the example of the semiconductor device 2b illustrated in FIG. 8B, the metal layer MG1 of the second dummy gate 347_1 is positioned in the third trench 503, and the metal layer MG2 of the second dummy gate 347_1 protrudes above the level of the fin F1. The metal layer MG1 of the second dummy gate 347_1 extends along a side of the third trench 503 and the upper surface of the fin F1. Furthermore, the metal layer MG1 of the third dummy gate 347_2 is positioned in the third trench 503, and the metal layer MG2 of the third dummy gate 347_2 protrudes above the level of the fin F5. The metal layer MG1 of the third dummy gate 347_2 extends along a side of the third trench 503 and the upper surface of the fin F5.

Figure 8C:
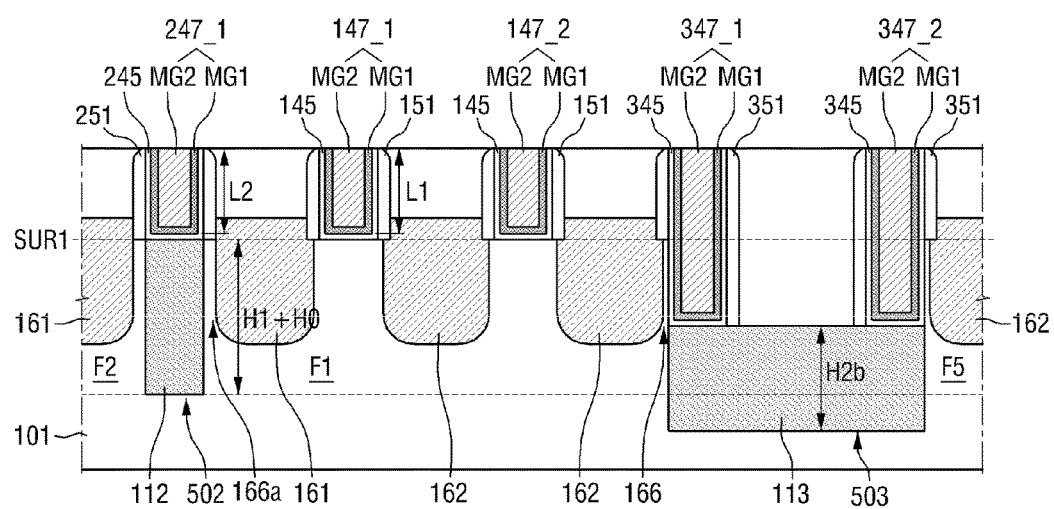
FIG. 8C is a cross-sectional view of still another example of the second embodiment of a semiconductor device according to the inventive concept.

In the example of the semiconductor device 2c illustrated in FIG. 8C, the metal layers MG1 and MG2 of the second dummy gate 347_1 are disposed entirely in the third trench 503, and the spacer 351 on only one side of the second dummy gate 347_1 extends on the upper surface of the fin F1. The metal layers MG1 and MG2 of the third dummy gate 347_2 are disposed entirely in the third trench 503, and the spacer 351 on only one side of the third dummy gate 347_2 extends on the upper surface of the fin F5.

A third embodiment of a semiconductor device 3 according to the inventive concept will now be described with reference to FIG. 9. To avoid redundancy, a detailed description is omitted of elements of the third embodiment that are the same or similar to those of the previously described first and second embodiments.

In the semiconductor device 3, the upper surface of the second field insulating film 112 is disposed at a level higher than that of the upper surface of the adjacent fin F1 or F2. The upper surface of the third field insulating film 113 may also be disposed at a level higher than that of the upper surface of the adjacent fin F1 or F5. Furthermore, the upper surfaces of the fins F1, F2, and F5 may lie in the plane SUR1, and the upper surface of the second field insulating film 112 and the upper surface of the third field insulating film 113 may lie in the same plane SUR2. The height of the second field insulating film 112 may be H1a+H0, and the height of the third field insulating film 113 is H2.

Accordingly, the height L3 of the first dummy gate 247_1 is less than the height L1 of the gate 147_1. The upper surface of the first dummy gate 247_1 and the upper surface of the gate 147_1 lie on the same plane because the first dummy gate 247_1 and the gate 147_1 are formed using a replacement process. Furthermore, the height L2 of the first dummy gate 247_1 is less than the height L1 of the gate 147_1 because the height of the second field insulating film 112 that is positioned on the lower portion of the first dummy gate 247_1 is less than the height of the fin F1 that is positioned on the lower portion of the gate 147_1.

Because the upper surface of the third field insulating film 113 is disposed at a level higher than that of the upper surface of the adjacent fin F1 or F5, one part of the second dummy gate 347_1 may be positioned on the upper surface of the fin F1, and the other part thereof may be positioned on the projecting third field insulating film 113. One part of the third dummy gate 347_2 may be positioned on the upper surface of the fin F5, and the other part thereof may be positioned in the projecting third field insulating film 113.

Figure 9:
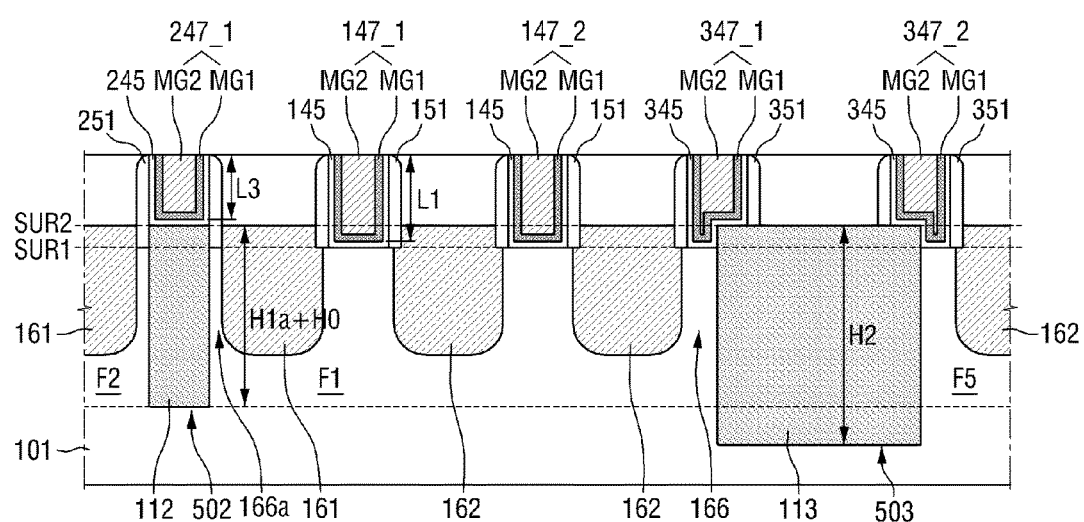
FIG. 9 is a cross-sectional view of a third embodiment of a semiconductor device according to the inventive concept.

FIG. 9 illustrates that the upper surface of the second field insulating film 112 and the upper surface of the third field insulating film 113 lie on the same plane SUR2. Alternatively, though, the upper surface of the second field insulating film 112 and the upper surface of the third field insulating film 113 may lie on different planes.

Figure 10:
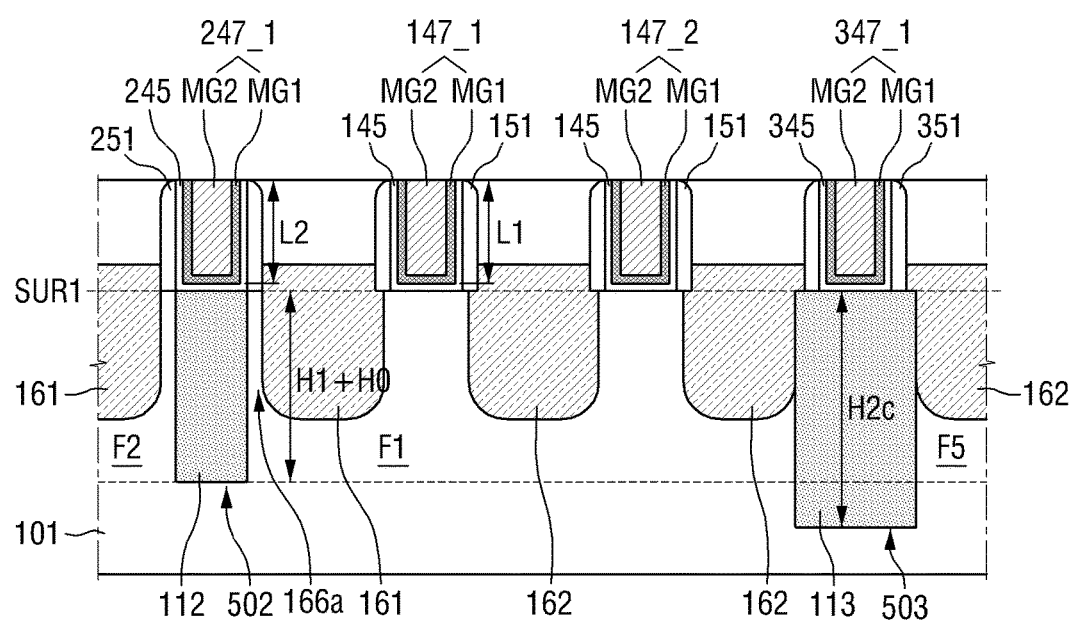
FIG. 10 is a cross-sectional view of a fourth embodiment of a semiconductor device according to the inventive concept.

A fourth embodiment of a semiconductor device 4 according to the inventive concept will now be described with reference to FIG. 10. To avoid redundancy, a detailed description is omitted of elements of the fourth embodiment that are the same or similar to those of the previously described first through third embodiments.

In the semiconductor device 4, a single diffusion break is formed between the fin F1 and the fin F2, and a single diffusion break is also formed between the active region ACT1 and the active region ACT12 (i.e., between the fin F1 and the fin F5). That is, only one dummy gate 347_1 is disposed on the third field insulating film 113 between adjacent active regions.

Furthermore, the upper surface of the third field insulating film 113 and the upper surface of the second field insulating film 112 may be positioned on the same plane SUR1 as the upper surfaces of the fins.

On the other hand, for clear isolation between the active region ACT1 and the active region ACT12, the third field insulating film 113 may have a relatively great height H2c (e.g., may extend from the plane SUR1 of the upper surfaces of the fins F1 and F2 more deeply into the substrate 101 than the second field insulating film 112).

Figure 11:
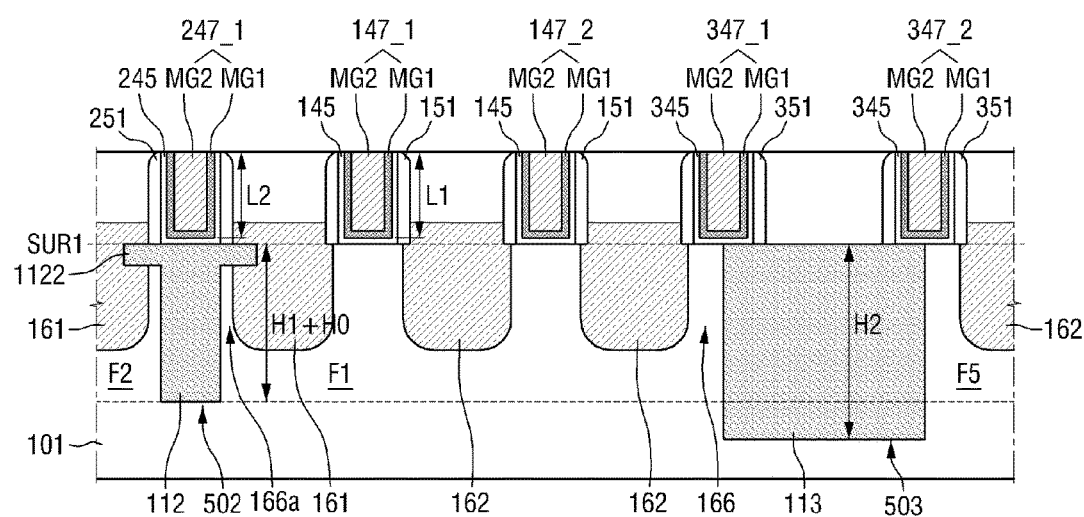
FIG. 11 is a cross-sectional view of a fifth embodiment of a semiconductor device according to the inventive concept.

A fifth embodiment of a semiconductor device 5 according to the inventive concept will now be described with reference to FIG. 11. To avoid redundancy, a detailed description is omitted of elements of the fifth embodiment that are the same or similar to those of the previously described first through fourth embodiments.

In the semiconductor device 5, the second field insulating film 112 has a T-shaped cross section in a vertical plane.

Specifically, the second field insulating film 112 includes projections 1122 that project into the sides of upper portions of the fins F1 and F2, respectively. The thickness of the projections 1122 may be in a range of from 0.01 Å to 300 Å.

Due to such projections 1122, even if there is an alignment error in the process of forming the dummy gate 247_1, there is a high possibility that the dummy gate 247_1 will nonetheless be formed on the second field insulating film 112. Otherwise, if the dummy gate 247_1 were formed on the fin (e.g., F1 or F2) instead of on the second field insulating film 112, a defect (e.g., bridge defect) could occur between the dummy gate 247_1 and the fin F1 or F2.

The third field insulating film 113 may also have a similar T-shaped cross section.

In the embodiments described above, it should be noted that the term "dummy gate" does not necessarily mean that the conductive trace (or wiring) forming the dummy gate is electrically non-functional along its entire length. This aspect of embodiments of the inventive concept is discussed next with reference to the plan view of FIG. 12A and the cross-sectional view of FIG. 12B.

Figure 12A:
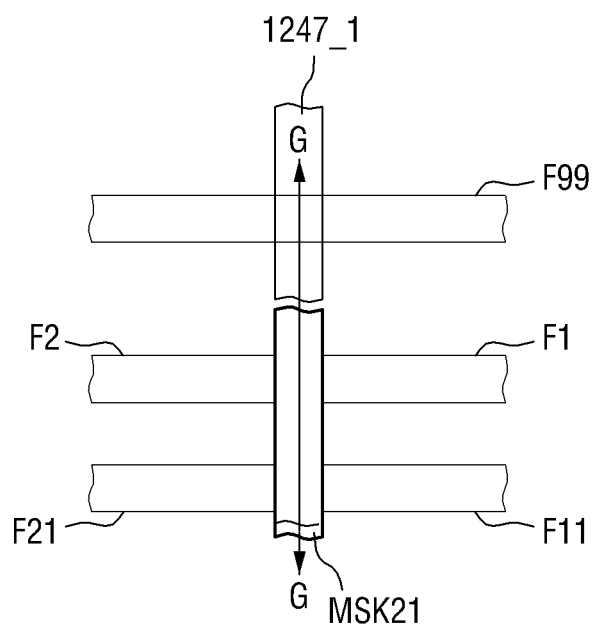
FIG. 12A is a plan view for explaining a dummy gate according to one or more embodiments of a semiconductor device according to the inventive concept.
Figure 12B:
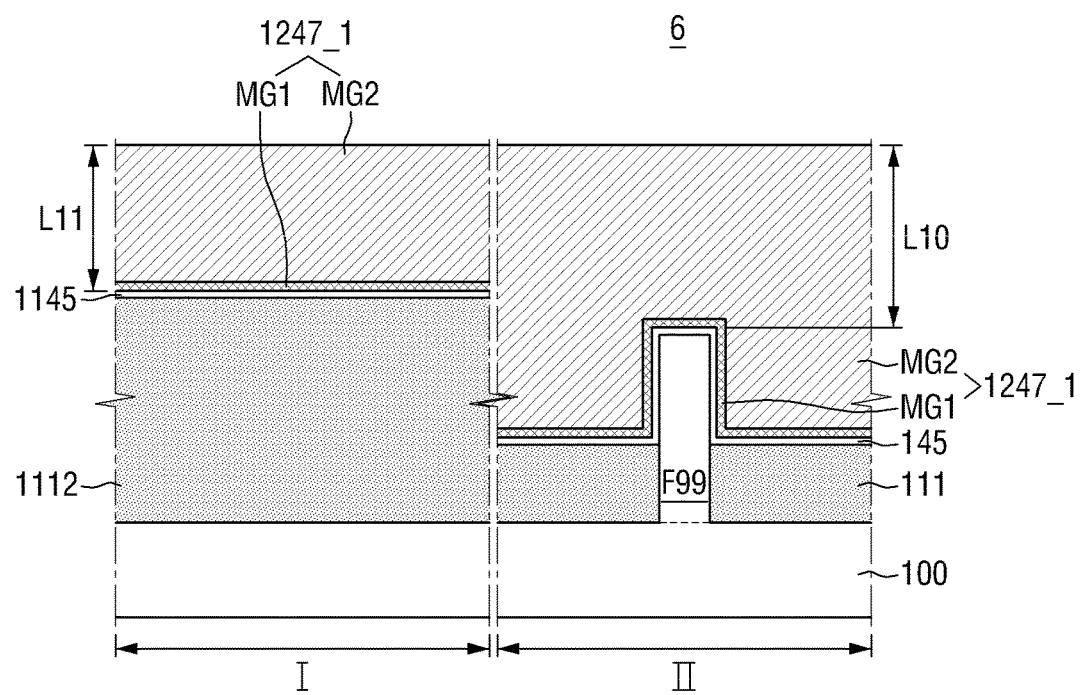
FIG. 12B is an exemplary cross-sectional view taken along line G-G of FIG. 12A.

Referring to FIGS. 12A and 12B, in the semiconductor device 6, the gate 1247_1 extends longitudinally in the first direction X1. The gate 1247_1 may operate as a dummy gate in a first region I, and may operate as a normal (i.e., electrically active) gate in a second region II. That is, as illustrated, the gate 1247_1 may be disposed on the field insulating film 1112 (corresponding to film 112 in FIG. 3) in the first region I to serve as a dummy gate, and may cross the fin F99 in the second region II to serve as a normal gate.

In this case, the gate 1247_1 may have different thicknesses. For example, the thickness of the gate 1247_1 on the field insulating film 1112 in the first region I may be L11, and the thickness of the gate 1247_1 on the fin F99 in the second region II may be L10>L11. On the other hand, the upper surface of the gate 1247_1 may be coplanar the regions I and II because the gate 1247_1 is made through a planarization process.

Figure 12C:
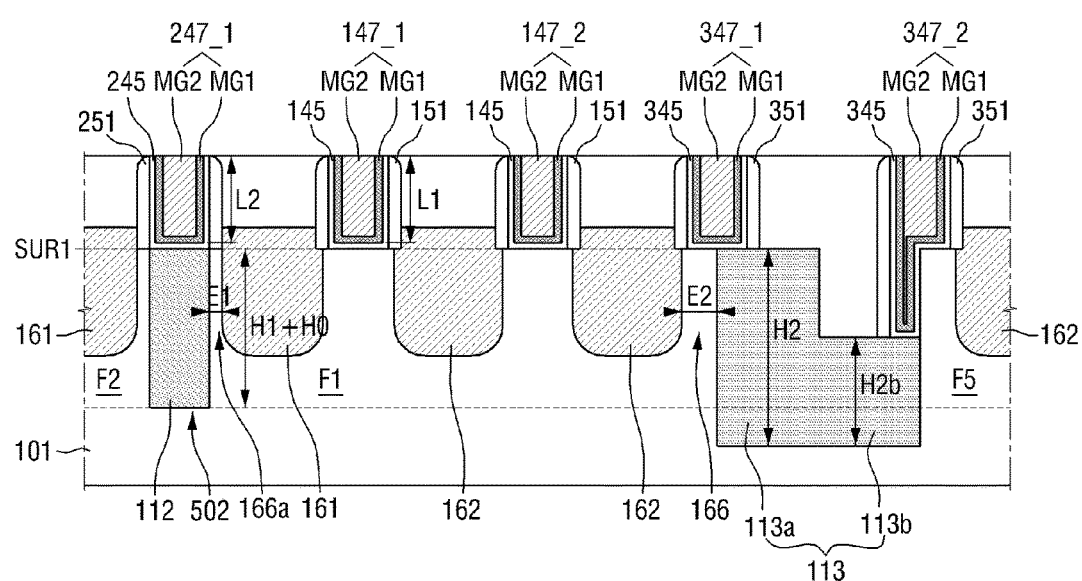
FIG. 12C is a cross-sectional view for explaining a semiconductor device according to another embodiment of the inventive concept.

FIG. 12C is a cross-sectional view of a semiconductor device 6a according to another embodiment of the inventive concept. In the description of FIG. 12C, subject matter which is substantially the same as that described previously in connection with FIGS. 7 and 8A will be omitted to avoid redundancy.

Referring to FIG. 12C, in a semiconductor device 6a according to an embodiment of the inventive concept, a third field insulating film 113 may include a first region 113a and a second region 113b. An upper surface of the first region 113a may be positioned on the same plane SUR1 as an upper surface of the adjacent fin F1, and an upper surface of the second region 113b may be lower than an upper surface of the adjacent fin F1 or F2. Accordingly, the upper surface of the second region 113b of the third field insulating film 113 may be lower than the upper surface of the second field insulating film 112.

Further, the height H2b of the second region 113b of the third field insulating film 113 may be lower than the height H2 of the first region 113a, and may be lower than the height (H1+H0) of the second field insulating film 112.

As described above, since the heights of the first region 113a and the second region 113b of the third field insulating film 113 are different from each other, a second dummy gate 347_1 arranged on the first region 113a of the third field insulating film 113 and a third dummy gate 347_1 arranged on the second region 113b of the third field insulating layer 113 may have different shapes as illustrated. Specifically, the shapes of the second dummy gate 347_1 and the third dummy gate 347_2 may be asymmetrical with each other as illustrated.

Specifically, although a second dummy gate 347_1 is positioned on the fin F1 and a third trench 503, one part of the third dummy gate 347_2 may be positioned on an upper surface of a fin F5, and the other part thereof may be positioned in the third trench 503.

More specifically, although metal layers MG1 and MG2 of the second dummy gate 347_1 are positioned on the fin F1 and the third trench 503 as illustrated, parts of the metal layers MG1 and MG2 of the third dummy gate 347_2 may be positioned in the third trench 503. That is, the metal layers MG1 and MG2 of the third dummy gate 347_2 may be arranged along a side wall of the third trench 503 and an upper surface of the third trench 503. The metal layers MG1 and MG2 of the second and third dummy gates 347_1 and 347_2 may include a material for adjusting a work function thereof.

Hereinafter, an exemplary method of fabricating a semiconductor device according to the inventive concept will be described with reference to the plan views and perspective views of FIGS. 13 to 22. For these purposes, the method will be described with reference to the manufacturing of a device of the type shown in and described with reference to FIGS. 1 to 7. However, the applicability of the method to the manufacturing of the other embodiments of semiconductor devices according to the inventive concept will be readily apparent.

Figure 13:
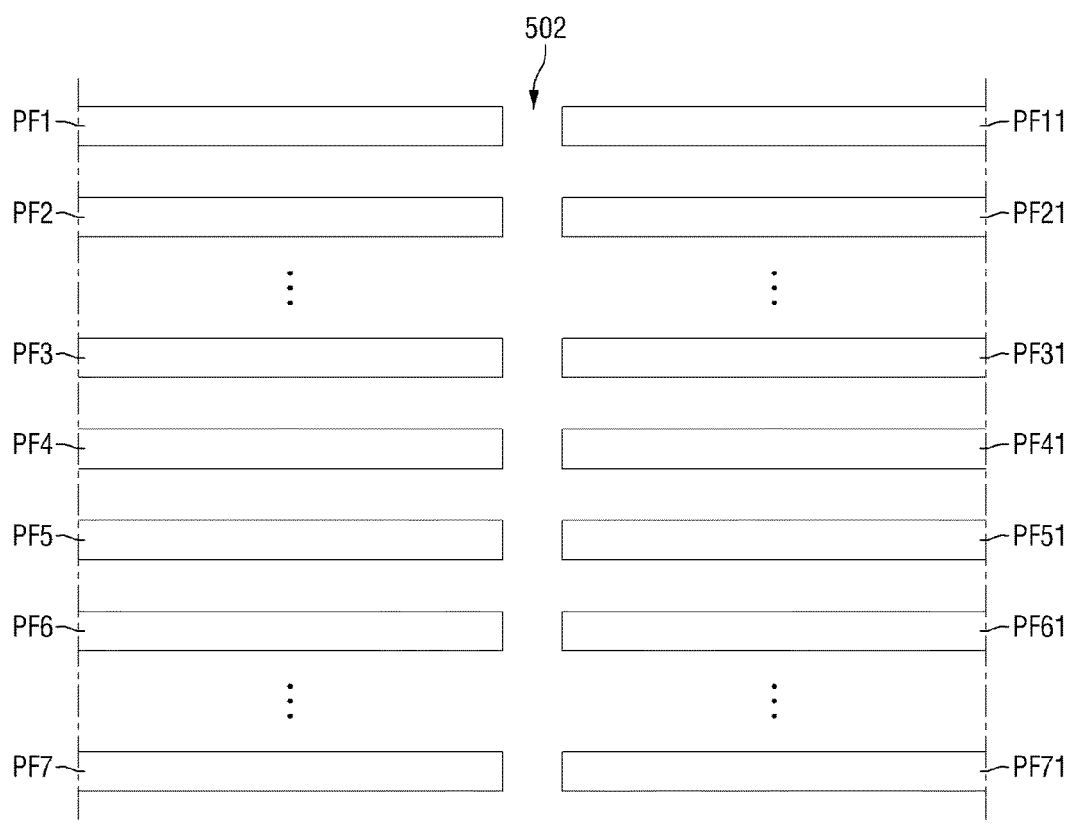
FIGS. 13, 14, 15, 16, 17, 18, 19, 20, 21 and 22 are layout views and perspective views for reference in describing a method of fabricating a semiconductor device according to the inventive concept.
Figure 14:
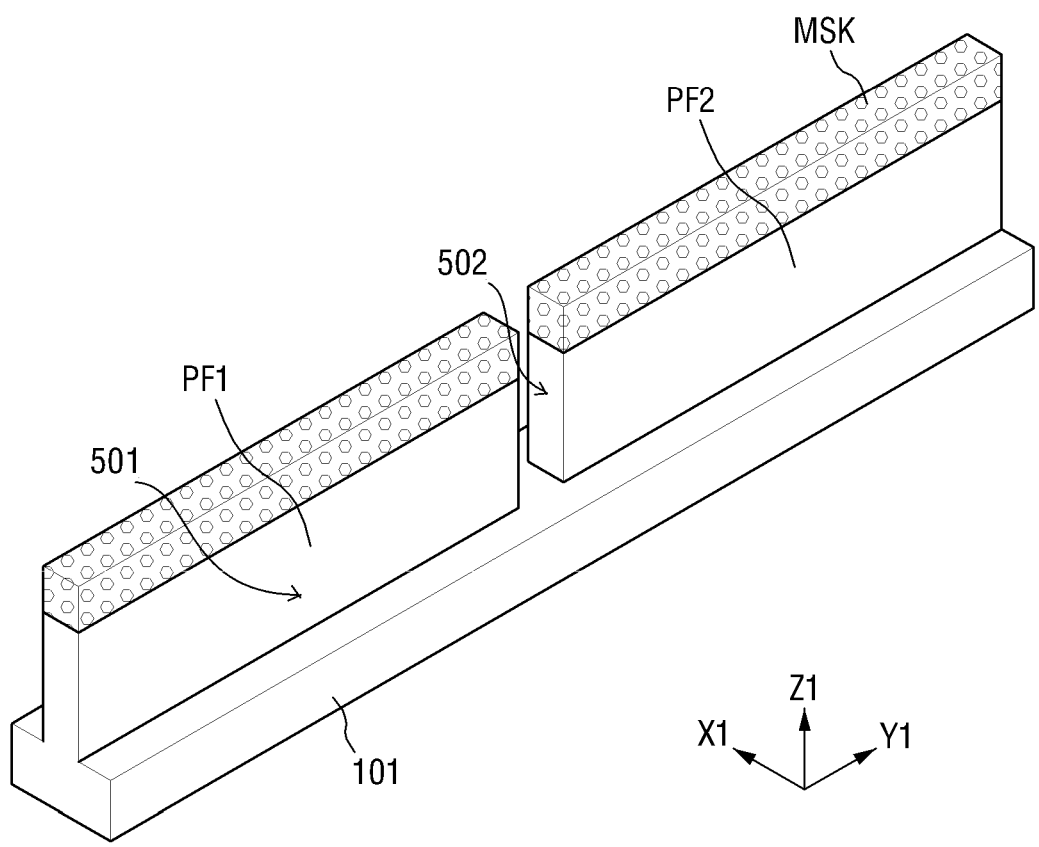

First, referring to FIGS. 13 and 14, a mask MSK is formed on a substrate 101, and a plurality of preliminary fins PF1 to PF7 and PF11 to PF71 are formed using the mask MSK. More specifically, shallow trenches 501 and 502 are formed by etching the substrate 101 using the mask MSK as an etch mask to form the preliminary fins PF1 to PF7 and PF11 to PF 71.

The plurality of preliminary fins PF1 to PF7 and PF11 to PF71 extend longitudinally in the second direction Y1. The plurality of preliminary fins PF1 to PF7 and PF11 to PF71 may be arranged in a matrix. In this case, for example, the preliminary fins PF1 and the preliminary fin PF11 may be aligned in their lengthwise directions, and the preliminary fin PF1 and the preliminary fin PF2 may be disposed adjacent to each other in their widthwise directions.

Figure 15:
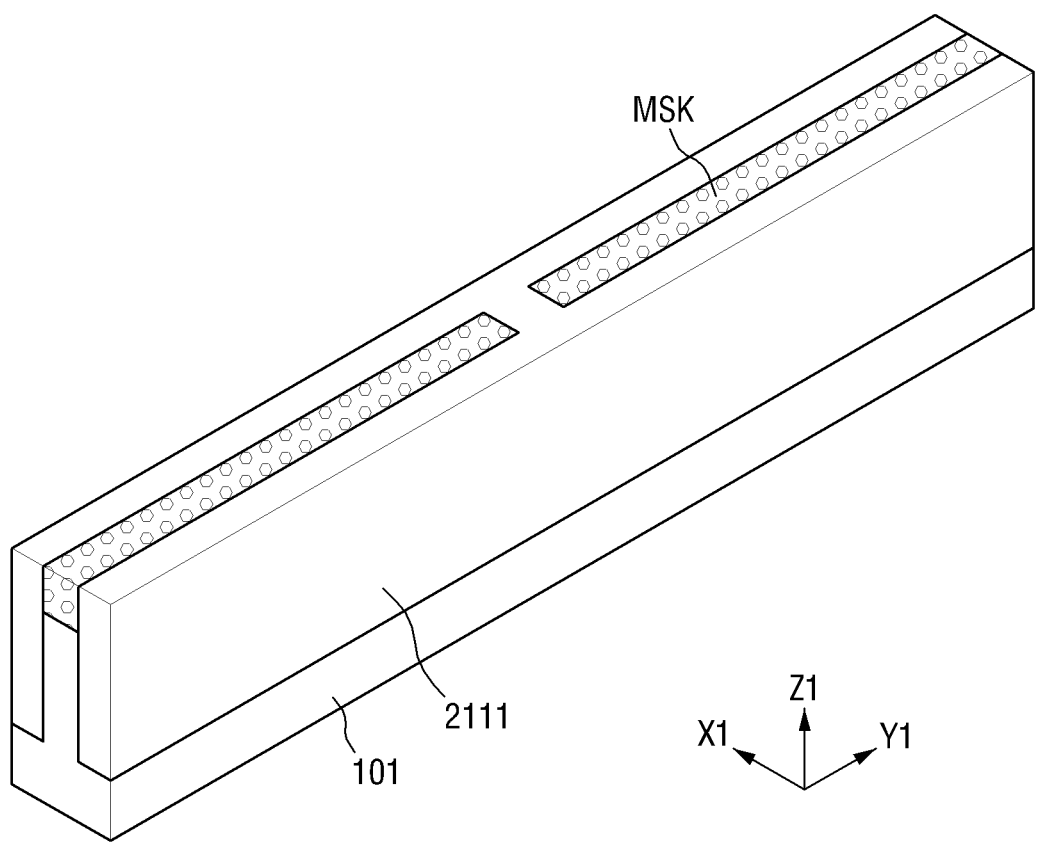

Referring to FIG. 15, an insulating film 2111 is formed to surround the plurality of preliminary fins PF1 to PF7 and PF11 to PF71 and the mask MSK. Specifically, an insulating layer is formed to cover the plurality of preliminary fins PF1 to PF7 and PF11 to PF71 and the mask MSK completely, and the insulating layer is planarized until the upper surface of the mask MSK is exposed. Here, the insulating film 2111 may be formed of an oxide, a nitride, an oxynitride, or a combination thereof.

Figure 16:
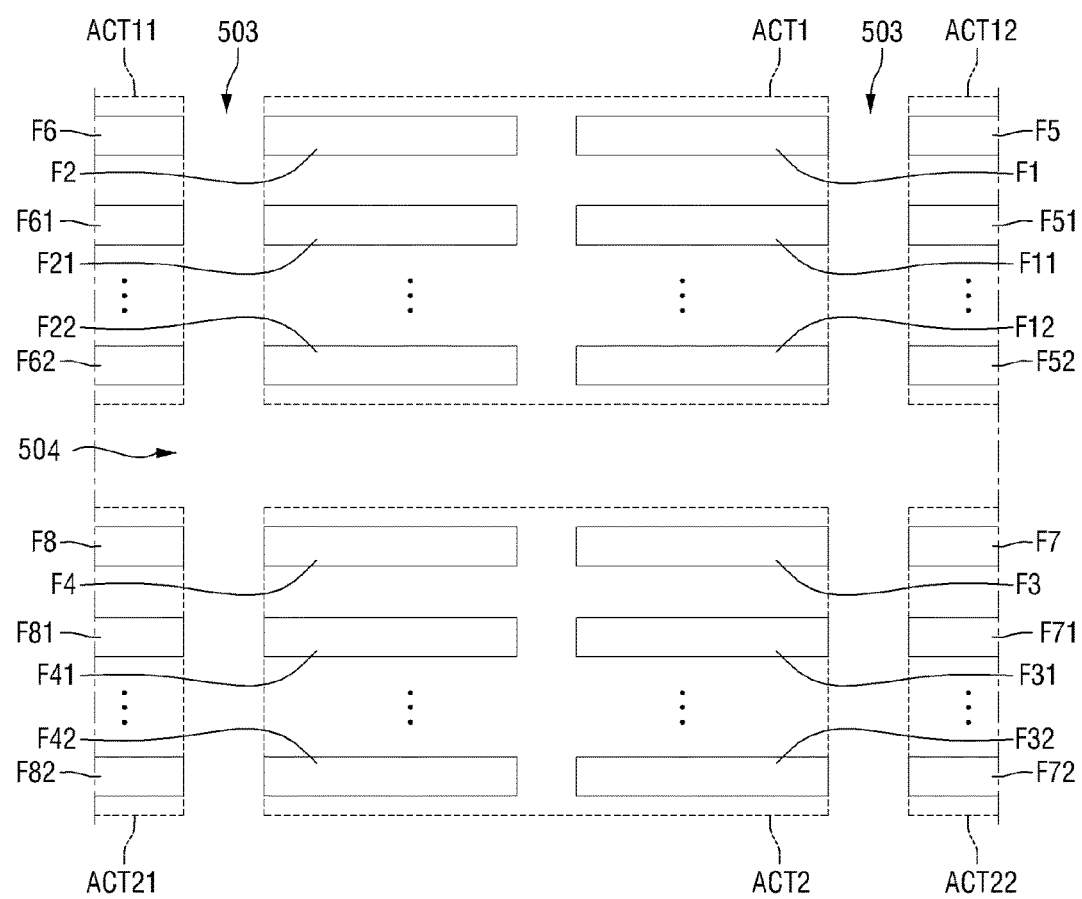
Figure 17:
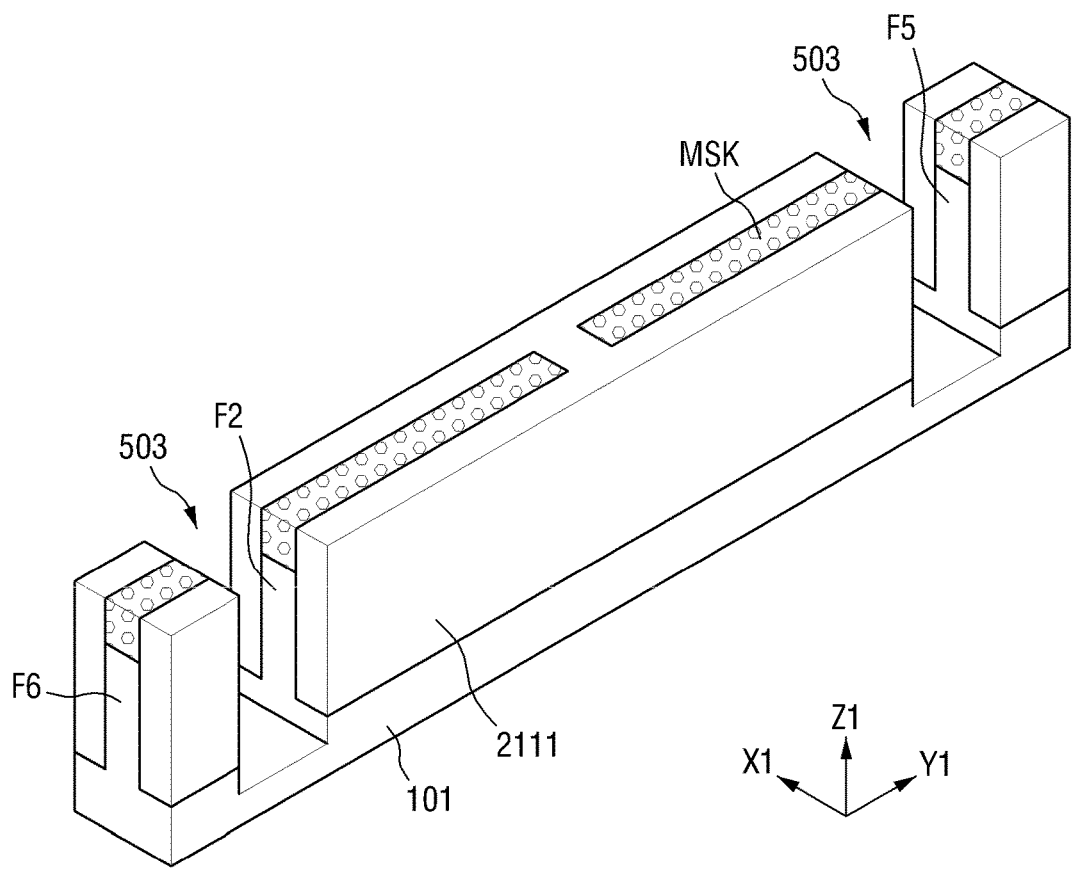

Referring to FIGS. 16 and 17, deep trenches 503 and 504 are then formed by etching away parts of the plurality of preliminary fins PF1 to PF7 and PF11 to PF71, a part of the mask MSK, and a part of the insulating film 2111. As a result, a plurality of active regions ACT1, ACT2, ACT11, ACT 21, ACT12 and ACT22 are defined. Furthermore, a plurality of fins F1 to F2, F11 to F21, and F12 to F22 are formed from the plurality of preliminary fins PF1 to PF7 and PF11 to PF71. In this respect, a dry etching process that does not have high etch selectivity may be used, considering that the preliminary fins PF1 to PF7 and PF11 to PF71, the mask MSK, and the insulating film 2111 are simultaneously etched.

Each deep trench 503 is formed to extend longitudinally in the first direction X1, and each deep trench 504 is formed to extend longitudinally in the second direction Y1. The deep trenches 503 and 504 cross each other.

Figure 18:
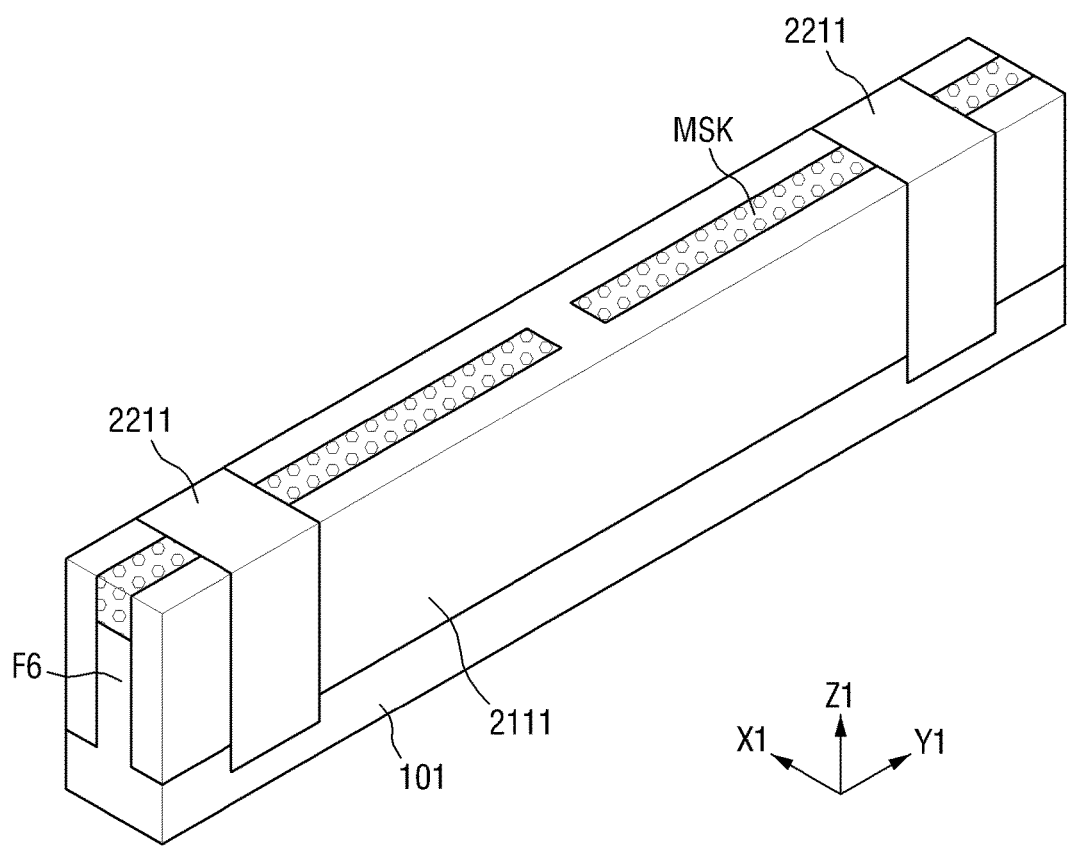

Referring to FIG. 18, an insulating film 2211 is then formed to fill the deep trenches 503 and 504. Specifically, an insulating layer is formed to cover the plurality of fins F1 to F2, F11 to F21, and F12 to F22 and the mask MSK completely, and the insulating layer is planarized until the upper surface of the mask MSK is exposed. The insulating film 2211 may be formed of an oxide, a nitride, an oxynitride, or a combined thereof. The insulating film 2211 may be made of the same material or a different material as the insulating film 2111.

Figure 19:
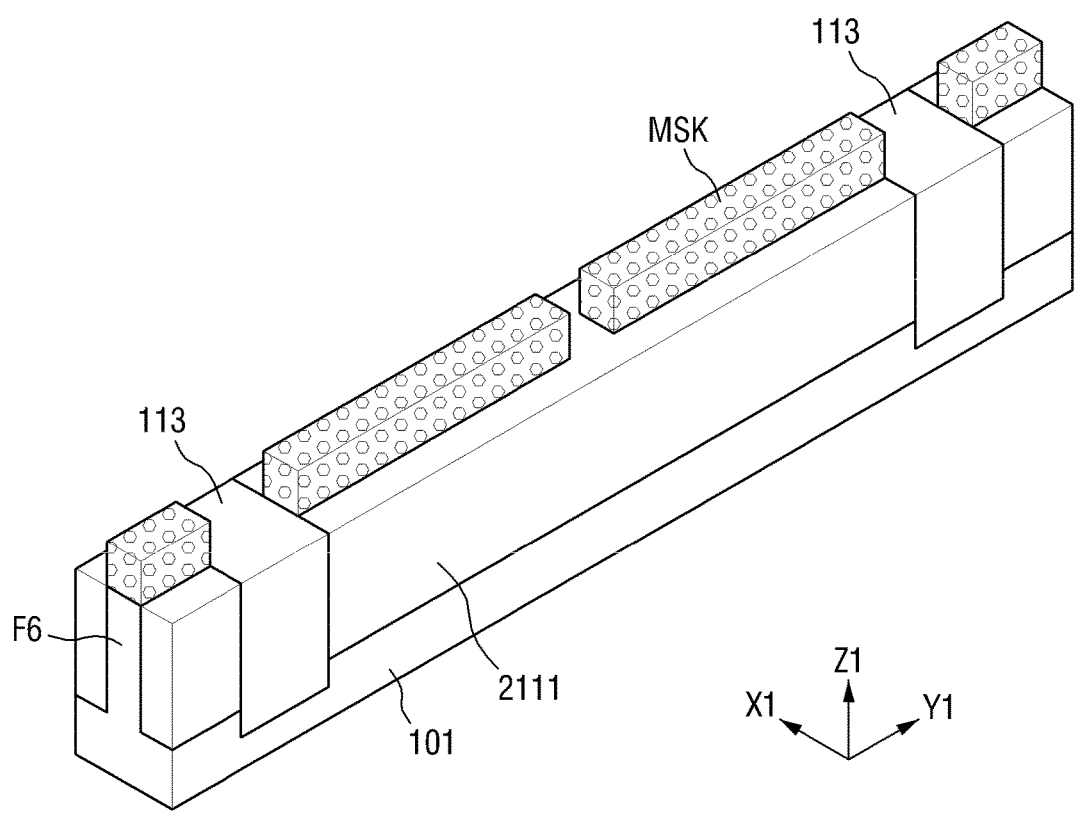

Referring to FIG. 19, the side wall of the mask MSK is then exposed by removing upper portions of the insulating film 2211 and the insulating film 2111, e.g., by etching back the insulating films 2211 and 2111.

Figure 20:
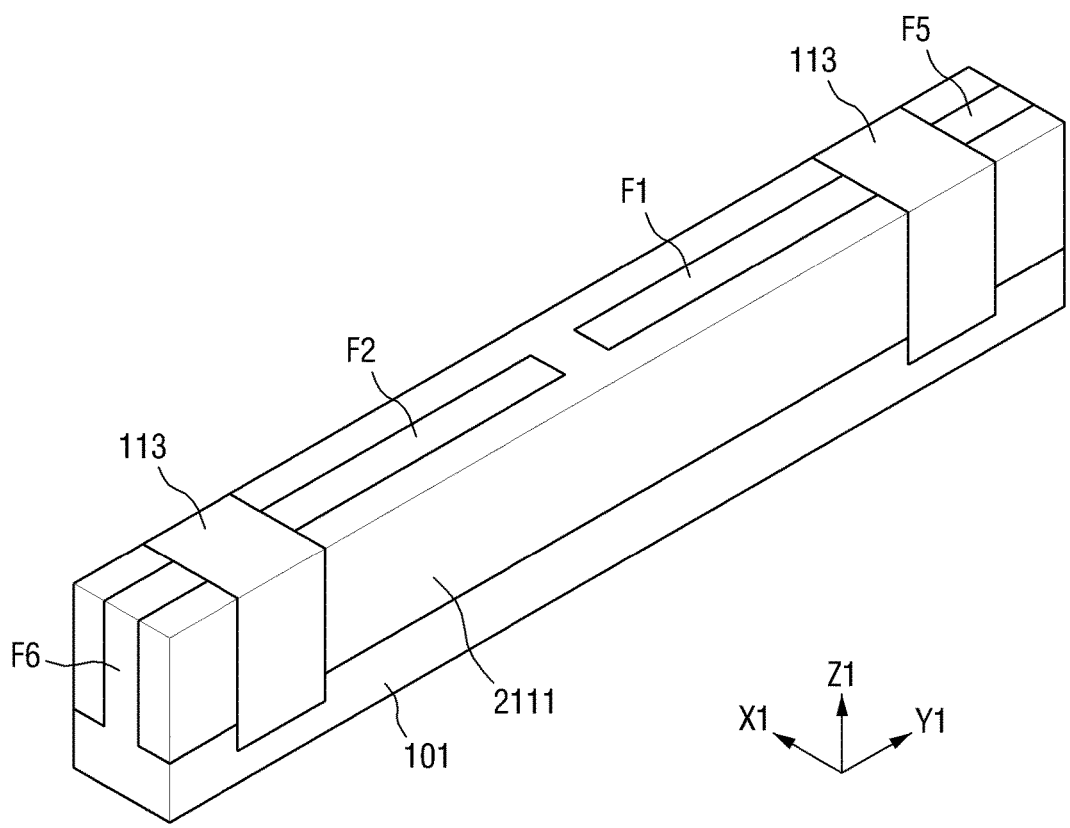

Referring to FIG. 20, the exposed mask MSK is then removed.

Figure 21:
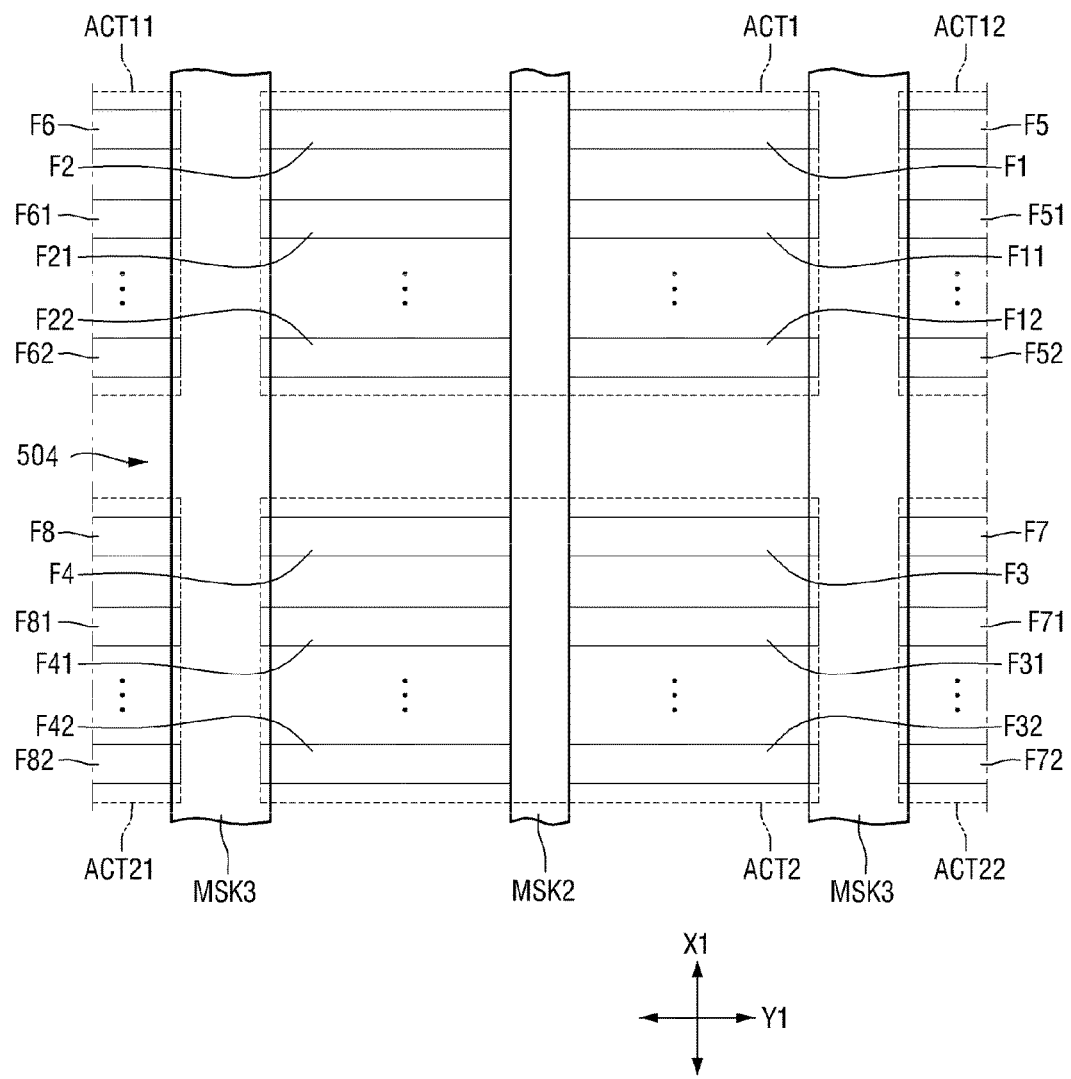
Figure 22:
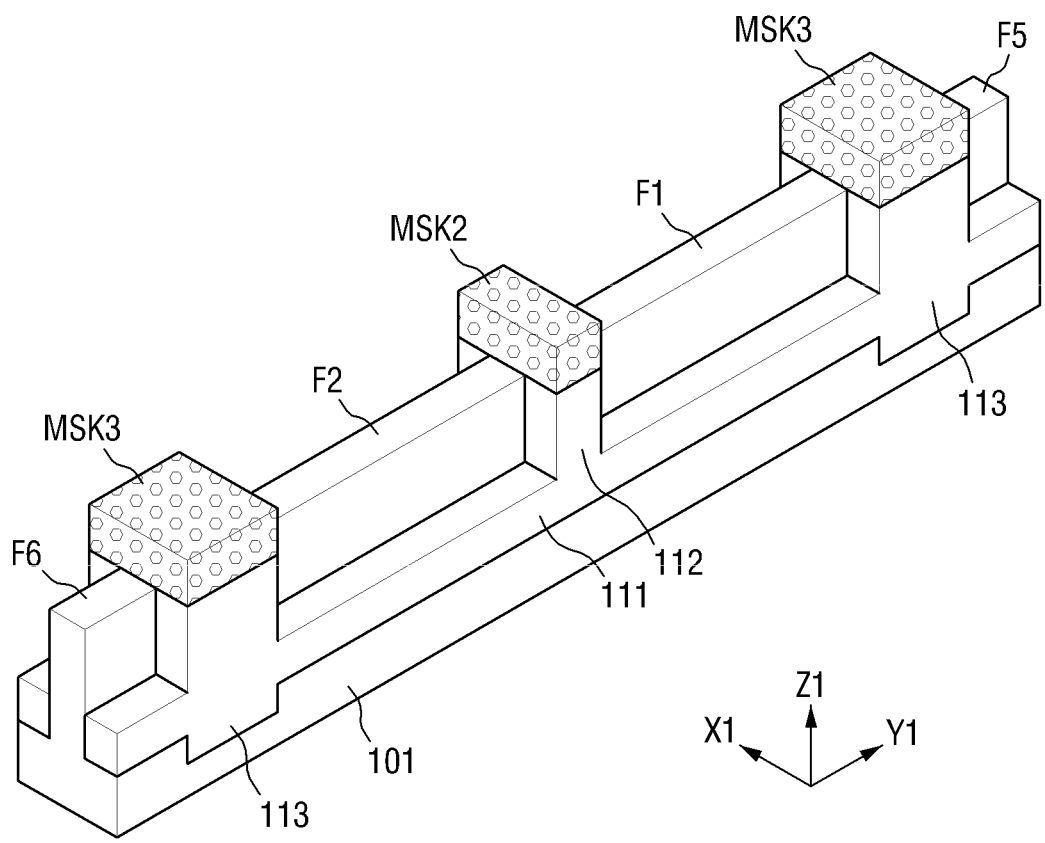

Referring to FIGS. 21 and 22, a mask MSK2 is formed in a region where the second field insulating film 112 is to be formed, and a mask MSK3 is formed in each region where a third field insulating film 113 is formed. The masks MSK2 and MSK3 may be formed to extend longitudinally in the first direction X1.

A field recess process is then performed using the masks MSK2 and MSK3 as an etch mask. That is, part of the insulating film 2211 and part of the insulating film 2111 are removed by a controlled etching process to form the first field insulating film 111 and the second field insulating film 112, while leaving the third field insulating films 113. As the result of the field recess process, upper parts of the side walls of the fins F1 to F2, F11 to F21, and F12 to F22 are exposed. Furthermore, the second and third field insulating films 112 and 113 extend higher than the first field insulating film 111.

Referring again to FIGS. 1 and 3, a plurality of transistor gates (e.g., 147_1, 147_2, 147_5 and 147_6) are formed on each of the fins (e.g., F1, F2, F11, F21, F12 and F22) in each active region (e.g., ACT1), and a plurality of dummy gates (e.g., 247_1, 347_1 and 347_3) are formed on the first, second and third field insulating films 111, 112, and 113 that separate fins of each active region from each other and that separate active regions from one another.

For example, in a representative portion of the first embodiment, a plurality of gates 147_1, 147_2 are formed on and extend across each of the fins F1, F11 and F21, and a plurality of gates are 147_5, and 147_6 are formed and extend across each of the fins F2, F21 and F22 of first active region ACT1. Dummy gate 247_1 is formed on the second field insulating film 112 separating fins F1, F11 and F21 from fins F2, F21 and F22, respectively in active region ACT1, dummy gate 347_1 is formed on the third field insulating film 113 that separates active region ACT1 from active region ACT12, and dummy gate 347_2 is formed the third field insulating film 113 that separates active region ACT1 from active region ACT11.

Figure 23:
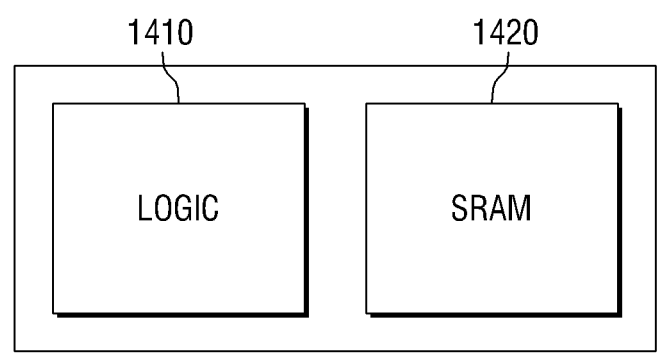
FIG. 23 is a block diagram of an electronic device including a semiconductor device according to one or more embodiments of the inventive concept.

FIG. 23 illustrates an example of an electronic device 7 which may incorporate a semiconductor device according to one or more of the above-described embodiments of the inventive concept.

The electronic device 7 has a logic region 1410 and an SRAM region 1420, each of which may include transistors devices such as those described herein. Further, different kinds of diffusion breaks may be used in the logic region 1410 and the SRAM region 1420. For example, a single diffusion break may be used in the logic region 1410, and a double diffusion beak may be used in the SRAM region 1420.

Figure 24:
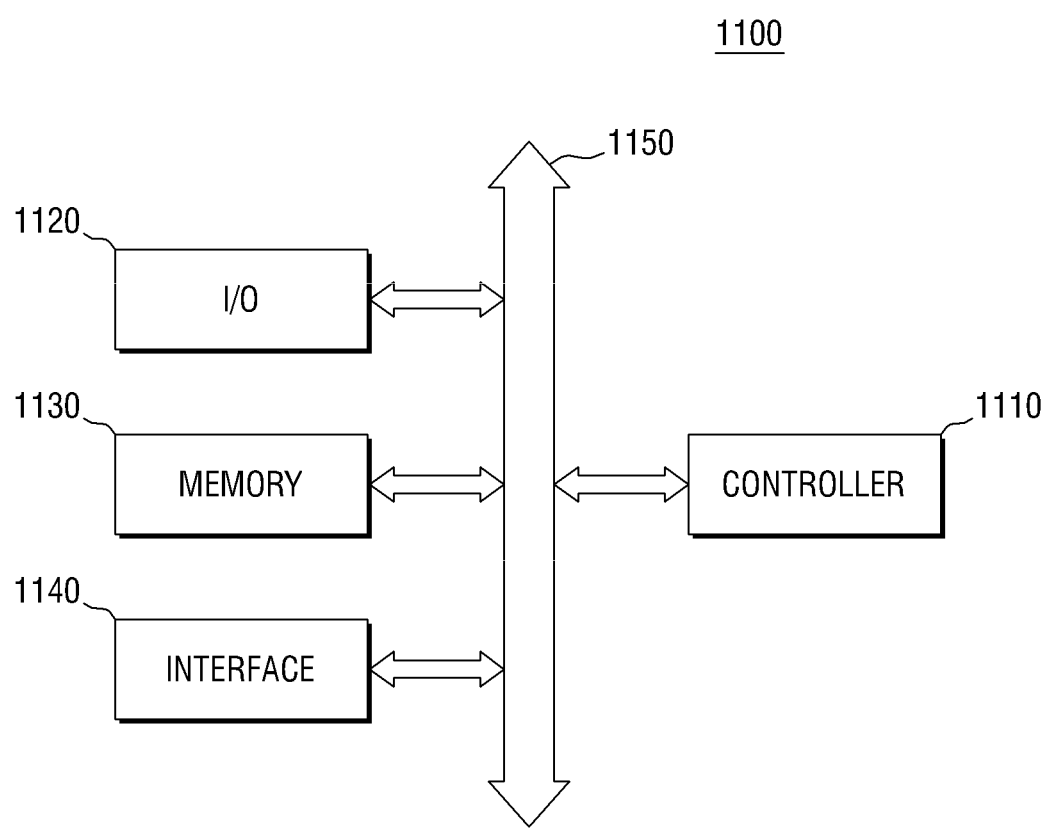
FIG. 24 is a block diagram of an electronic system including a semiconductor device according to one or more embodiments of the inventive concept.

FIG. 24 illustrates an example of an electronic system 1100 comprising a semiconductor device according to the inventive concept.

The electronic system 1100 of this example includes a controller 1110, an input/output (I/O) device 1120, a memory 1130, an interface 1140, and a bus 1150. The controller 1110, the I/O device 1120, the memory 1130, and/or the interface 1140 may be coupled to one another through the bus 1150. The bus 1150 provides paths through which data is transferred.

The controller 1110 may include at least one of a microprocessor, a digital signal processor, a microcontroller, and logic elements that can perform similar functions. The I/O device 1120 may include a keypad, a keyboard and/or a display device. The memory 1130 may store data and/or commands The interface 1140 may function to transfer the data to a communication network or receive the data from the communication network. The interface 1140 may be of a wired or wireless type. For example, the interface 1140 may include an antenna or a wire/wireless transceiver. Although not illustrated, the electronic system 1100 may further include a high-speed DRAM and/or SRAM as an operating memory for improving the operation of the controller 1110. A semiconductor device according to one or more embodiments of the inventive concept may be employed by the memory 1130 or may be provided as a part of the controller 1110 and the I/O device 1120.

The electronic system 1100 may be that of a PDA (Personal Digital Assistant), a laptop computer, a web tablet, a wireless phone such as a mobile phone, a digital music player, a memory card, or any of various other types of electronic devices that can transmit and/or receive information in a wireless manner.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A semiconductor device, comprising:
    a substrate having first and second trenches, and first, second and third fins longitudinally aligned in a first direction, wherein the first trench extends between the first and second fins, and the second trench extends between the second and third fins;
    a first portion of a field insulating material disposed in the first trench as interposed between the first and second fins, and a second portion of the field insulating material disposed in the second trench as interposed between the second and third fins, wherein an upper surface of the second portion of the field insulating material is recessed in the second trench at a level below uppermost surfaces of the second and third fins;
    a plurality of active gates disposed on the first, second and third fins;
    only one dummy gate situated along the first direction between the first fin and the second fin, said one dummy gate being disposed on an upper surface of the first portion of the field insulating material; and
    another dummy gate situated along the first direction between the second fin and the third fin, at least partially extending into the second trench to the upper surface of the second portion of the field insulating material.

2. The semiconductor device as claimed in claim 1, wherein a depth of the first trench is less than a depth of the second trench.

3. The semiconductor device as claimed in claim 2, wherein a width of the first trench in the first direction is less than a width of the second trench in the first direction.

4. The semiconductor device as claimed in claim 1, further comprising source/drain regions between adjacent active gates, between said one dummy gate and one of the adjacent active gates, and between said another dummy gate and another of the adjacent active gates.

5. A semiconductor device, comprising:
    a substrate having first and second trenches, and first, second and third fins longitudinally aligned in a first direction, wherein the first trench extends between the first and second fins, and the second trench extends between the second and third fins;
    a first portion of a field insulating material disposed in the first trench as interposed between the first and second fins, and a second portion of the field insulating material disposed in the second trench as interposed between the second and third fins, wherein an upper surface of the second portion of the field insulating material is recessed in the second trench at a level below uppermost surfaces of the second and third fins;
    a plurality of active gates disposed on the first, second and third fins;
    a first dummy gate disposed on an upper surface of the first portion of the field insulating material and aligned in the first direction with the first trench and the first portion of the field insulating material; and
    a second dummy gate at least partially extending into the second trench to the upper surface of the second portion of the field insulating material and offset in the first direction with respect to the second trench and the second portion of the field insulating material.

6. The semiconductor device as claimed in claim 5, wherein a depth of the first trench is less than a depth of the second trench.

7. The semiconductor device as claimed in claim 6, wherein a width of the first trench in the first direction is less than a width of the second trench in the first direction.

8. The semiconductor device as claimed in claim 5, further comprising source/drain regions between adjacent active gates, between said first dummy gate and one of the adjacent active gates, and between said second dummy gate and another of the adjacent active gates.

* * * * *